(12) United States Patent
Son et al.

(10) Patent No.: US 11,751,434 B2
(45) Date of Patent: Sep. 5, 2023

(54) SEMICONDUCTOR DEVICE INCLUDING AN OXIDE THIN FILM TRANSISTOR

(71) Applicant: SAMSUNG DISPLAY CO., LTD., Yongin-si (KR)

(72) Inventors: Kyoungseok Son, Seoul (KR); Dohyun Kwon, Seongnam-si (KR); Jonghan Jeong, Yongin-si (KR); Jonghyun Choi, Seoul (KR); Eoksu Kim, Seoul (KR); Jaybum Kim, Seoul (KR); Junhyung Lim, Seoul (KR); Jihun Lim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/453,522

(22) Filed: Nov. 4, 2021

(65) Prior Publication Data

US 2022/0059634 A1 Feb. 24, 2022

Related U.S. Application Data

(60) Division of application No. 16/836,490, filed on Mar. 31, 2020, now Pat. No. 11,171,193, which is a
(Continued)

(30) Foreign Application Priority Data

Aug. 30, 2016 (KR) .................. 10-2016-0111016

(51) Int. Cl.
*H10K 59/121* (2023.01)
*G09G 3/3225* (2016.01)
(Continued)

(52) U.S. Cl.
CPC ....... *H10K 59/1213* (2023.02); *G09G 3/3225* (2013.01); *G09G 3/3233* (2013.01);
(Continued)

(58) Field of Classification Search
CPC ............ H01L 27/3262; H01L 27/3258; H01L 27/3265; H01L 27/1225; H01L 27/1248;
(Continued)

(56) References Cited

U.S. PATENT DOCUMENTS 9,129,927 B2 9/2015 Gupta et al.
9,276,050 B2 * 3/2016 Kwon ............... H01L 29/78675
(Continued)

FOREIGN PATENT DOCUMENTS

JP 2016-195378 11/2015
JP 2016-006871 1/2016
(Continued)

*Primary Examiner* — Bo Fan
(74) *Attorney, Agent, or Firm* — F. CHAU & ASSOCIATES, LLC

(57) ABSTRACT

A semiconductor device includes a base substrate, a first transistor disposed on the base substrate, the first transistor including a first input electrode, a first output electrode, a first control electrode, and a first semiconductor pattern including a crystalline semiconductor, a second transistor disposed on the base substrate, the second transistor including a second input electrode, a second output electrode, a second control electrode, and a second semiconductor pattern including an oxide semiconductor, a plurality of insulating layers disposed on the base substrate, and an upper electrode disposed on the first control electrode with at least one insulating layer of the plurality of insulating layers interposed between the upper electrode and the first control electrode. The upper electrode overlaps the first control electrode and forms a capacitor with the first control electrode.

12 Claims, 26 Drawing Sheets

Related U.S. Application Data continuation of application No. 15/685,183, filed on Aug. 24, 2017, now Pat. No. 10,629,665.

(51) Int. Cl.
| | |
|---|---|
| *H10K 59/124* | (2023.01) |
| *G09G 3/3233* | (2016.01) |
| *H10K 59/126* | (2023.01) |
| *G09G 3/3266* | (2016.01) |
| *G09G 3/3275* | (2016.01) |
| *H01L 27/12* | (2006.01) |
| *H01L 29/786* | (2006.01) |

(52) U.S. Cl.
CPC ....... *H10K 59/124* (2023.02); *H10K 59/1216* (2023.02); *G09G 3/3266* (2013.01); *G09G 3/3275* (2013.01); *G09G 2300/0413* (2013.01); *G09G 2300/0426* (2013.01); *G09G 2310/08* (2013.01); *H01L 27/1225* (2013.01); *H01L 27/1248* (2013.01); *H01L 27/1251* (2013.01); *H01L 27/1255* (2013.01); *H01L 29/7869* (2013.01); *H01L 29/78633* (2013.01); *H01L 29/78675* (2013.01); *H10K 59/126* (2023.02)

(58) Field of Classification Search
CPC ......... H01L 29/78633; H01L 29/78675; H01L 29/7869
USPC ....... 257/40, 43, 88, 774, 72, 292, 231, 224; 438/59

See application file for complete search history.

(56) References Cited

U.S. PATENT DOCUMENTS

| | | | |
|---|---|---|---|
| 9,276,956 | B2 | 3/2016 | Kwon et al. |
| 9,530,805 | B2 | 12/2016 | Jin et al. |
| 10,263,199 | B2 | 4/2019 | Chang et al. |
| 10,629,665 | B2 | 4/2020 | Son et al. |
| 2007/0215985 | A1 | 9/2007 | Chen |
| 2008/0017958 | A1 | 7/2008 | Namkoong et al. |
| 2009/0020768 | A1 | 1/2009 | Butcher et al. |
| 2015/0053935 | A1* | 2/2015 | Gupta ............... H01L 27/1255 257/43 |
| 2016/0053935 | A1 | 2/2016 | Bevirt et al. |
| 2018/0061921 | A1* | 3/2018 | Son ....................... G09G 3/3233 |
| 2020/0235181 | A1 | 7/2020 | Son et al. |

FOREIGN PATENT DOCUMENTS

| | | |
|---|---|---|
| KR | 10-1408962 | 6/2014 |
| KR | 10-2015-0027381 | 3/2015 |
| KR | 10-2015-0051824 | 5/2015 |
| KR | 10-2015-0101418 | 9/2015 |
| KR | 10-1661802 | 10/2015 |
| KR | 10-2016-0013473 | 2/2016 |
| KR | 10-2016-0043327 | 4/2016 |
| KR | 10-2616-0100007 | 8/2016 |

* cited by examiner

SEMICONDUCTOR DEVICE INCLUDING AN OXIDE THIN FILM TRANSISTOR

CROSS-REFERENCE TO RELATED APPLICATION

This U.S. non-provisional patent application is a Division of U.S. non-provisional patent application Ser. No. 16/836,490, filed on Mar. 31, 2020 (now, U.S. Pat. No. 11,171,193 issued on Nov. 9, 2021), which is a Continuation of U.S. non-provisional patent application Ser. No. 15/685,183, filed on Aug. 24, 2017 (now, U.S. Pat. No. 10,629,665 issued on Apr. 21, 2020), which claims priority under 35 U.S.C. § 119 to Korean Patent Application No. 10-2016-0111016, filed on Aug. 30, 2016, the disclosures of which are incorporated by reference herein in their entirety.

TECHNICAL FIELD

The present invention relates to a semiconductor device, and more particularly, to a semiconductor device having an oxide thin film transistor.

DISCUSSION OF THE RELATED ART

A semiconductor device includes at least one thin film transistor. A thin film transistor includes a semiconductor pattern with a semiconductor material. A display device may include a plurality of pixels and a driving circuit for controlling the plurality of pixels. The driving circuit may include at least one thin film transistor. A thin film transistor included in the driving circuit provides electrical signals for controlling one or more pixels.

Each pixel may include a pixel driving circuit and a display element connected to the pixel driving circuit. The pixel driving circuit may include at least one thin film transistor and a capacitor. The at least one thin film transistor and the capacitor control the display element in response to an electrical signal provided from the driving circuit.

SUMMARY

According to an exemplary embodiment of the present invention, a semiconductor device includes a base substrate, a first transistor disposed on the base substrate, the first transistor including a first input electrode, a first output electrode, a first control electrode, and a first semiconductor pattern including a crystalline semiconductor, a second transistor disposed on the base substrate, the second transistor including a second input electrode, a second output electrode, a second control electrode, and a second semiconductor pattern including an oxide semiconductor, a plurality of insulating layers disposed on the base substrate, and an upper electrode disposed on the first control electrode with at least one insulating layer of the plurality of insulating layers interposed between the upper electrode and the first control electrode. The upper electrode overlaps the first control electrode and forms a capacitor with the first control electrode.

According to an exemplary embodiment of the present invention, a semiconductor device includes a base substrate, a first transistor disposed on the base substrate, the first transistor including a first input electrode, a first output electrode, a first control electrode, and a first semiconductor pattern including a crystalline semiconductor, a second transistor disposed on the base substrate, the second transistor including a second input electrode, a second output electrode, a second control electrode, and a second semiconductor pattern including an oxide semiconductor, a plurality of insulating layers disposed on the base substrate, and an upper electrode disposed on the first control electrode. The first semiconductor pattern, the first control electrode and the upper electrode are stacked on one another with a first insulating layer of the plurality of insulating layers disposed between the first semiconductor pattern and the first control electrode, and a second insulating layer of the plurality of insulating layers disposed between the first control electrode and the upper electrode. The upper electrode and the first control electrode form a capacitor.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
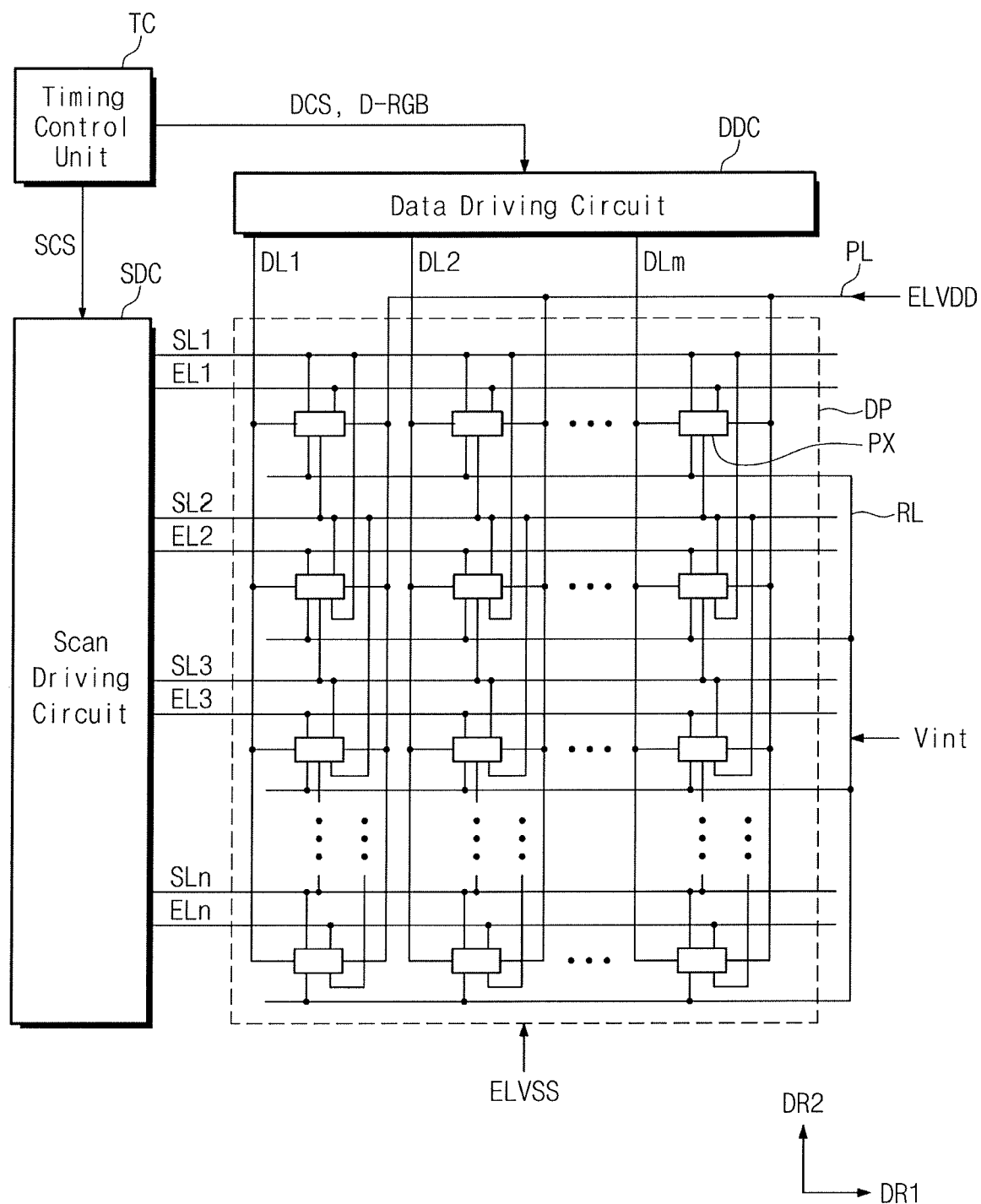
FIG. 1 is a block diagram illustrating a display device according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. The sizes or proportions of elements illustrated in the drawings may be exaggerated for clarity.

It will be understood that when an element such as a layer or substrate is referred to as being "on" another element, it can be directly on the other element, or intervening elements may also be present therebetween.

FIG. 1 is a block diagram illustrating a display device according to an exemplary embodiment of the present invention. A display device may be a semiconductor device, which includes at least one semiconductor. The display device includes a timing controller TC, a scan driving circuit SDC, a data driving circuit DDC, and a display panel DP. The display panel DP displays an image according to electrical signals provided from the scan driving circuit SDC and the data driving circuit DDC.

In an exemplary embodiment of the present invention, the display panel DP is an organic light emitting display panel. However, the present invention is not limited thereto, and the display panel DP may be, for example, a liquid crystal display panel, or the like.

The timing controller TC receives input image signals and generates image data D-RGB by converting a data format of the input image signals to match the interface specifications of the scan driving circuit SDC. The timing controller TC outputs the image data D-RGB and various other control signals, for example, control signals DCS and SCS.

The scan driving circuit SDC receives a scan control signal SCS from the timing controller TC. The scan control signal SCS may include a vertical start signal for stating an operation of the scan driving circuit SDC and a clock signal for determining the timing of output signals.

The scan driving circuit SDC generates a plurality of scan signals and sequentially outputs the plurality of scan signals to a plurality of scan lines SL1 to SLn. Additionally, the scan driving circuit SDC generates a plurality of light emitting control signals in response to the scan control signal SCS and outputs the plurality of light emitting control signals to a plurality of light emitting lines EL1 to ELn.

Although it is shown in FIG. 1 that scan signals and light emitting control signals are outputted from one scan driving circuit SDC, the present invention is not limited thereto. For example, according to an exemplary embodiment of the present invention, a plurality of scan driving circuits may be used to output scan signals and light emitting control signals. In addition, according to an exemplary embodiment of the present invention, a first driving circuit for generating and outputting scan signals and a second driving circuit for generating and outputting light emitting control signals may be separately provided.

The data driving circuit DDC receives a data control signal DCS and the image data D-RGB from the timing control unit TC. The data driving circuit DDC converts the image data D-RGB into data signals and outputs the data signals to the data lines DL1 to DLm. The data signals are analog voltages corresponding to the grayscale values of the image data D-RGB.

The display panel DP includes the scan lines SL1 to SLn, the light emitting lines EL1 to ELn, the data lines DL1 to DLm, and pixels PX. The scan lines SL1 to SLn extend in a first direction DR1 and are separated from each other in a second direction DR2 which is orthogonal to the first direction DR1.

Each of the plurality of light emitting lines EL1 to ELn may be arranged parallel with respect to a corresponding scan line, among the scan lines SL1 to SLn. The data lines DL1 to DLm intersect the scan lines SL1 to SLn and are insulated from the scan lines SL1 to SLn.

Each of the plurality of pixels PX is connected to a corresponding scan line, among the scan lines SL1 to SLn, to a corresponding light emitting line, among the light emitting lines EL1 to ELn, and to a corresponding data line, among the data lines DL1 to DLm.

Each of the pixels PX receives a first voltage ELVDD and a second voltage ELVSS, having a lower level than the first voltage ELVDD. Each of the pixels PX is connected to a power line PL, where the first voltage ELVDD is applied. Each of the pixels PX is connected to an initialization line RL for receiving an initialization voltage Vint.

Each of the plurality of pixels PX may be electrically connected to three scan lines. As shown in FIG. 1, the pixels PX of the second pixel row may be connected to the first to third scan lines SL1 to SL3.

The display panel DP may further include a plurality of dummy scan lines. The display panel DP may further include a dummy scan line connected to the pixels PX of the first pixel row and a dummy scan line connected to the pixels PX of the n-th pixel row. Additionally, pixels PX (hereinafter referred to as the pixels PX of a pixel column) connected to a data line, among the data lines DL1 to DLm, may be connected to each other. Two adjacent pixels PX, among the pixels PX of a pixel column, may be electrically connected to each other.

Each of the plurality of pixels PX may include an organic light emitting diode and a pixel driving circuit for controlling the light emission of the organic light emitting diode. The pixel driving circuit may include a plurality of thin film transistors and a capacitor. The scan driving circuit SDC and/or the data driving circuit DDC may include a thin film transistor formed through the same process as the process used to form the pixel driving circuit.

The scan lines SL1 to SLn, the light emitting lines EL1 to ELn, the data lines DL1 to DLm, the power line PL, the initialization line RL, the pixels PX, the scan driving circuit SDC, and the data driving circuit DDC may be formed on a base substrate through a plurality of photolithography processes. Through a plurality of deposition processes or coating processes, insulating layers may be formed on a base substrate. Each of the insulating layers may be a thin film for covering the entire display panel DP or include at least one insulation pattern overlapping a specific region of the display panel DP. The insulating layers may include an organic layer and/or an inorganic layer. In addition, a sealing layer for protecting the pixels PX may be formed on the base substrate.

Figure 2:
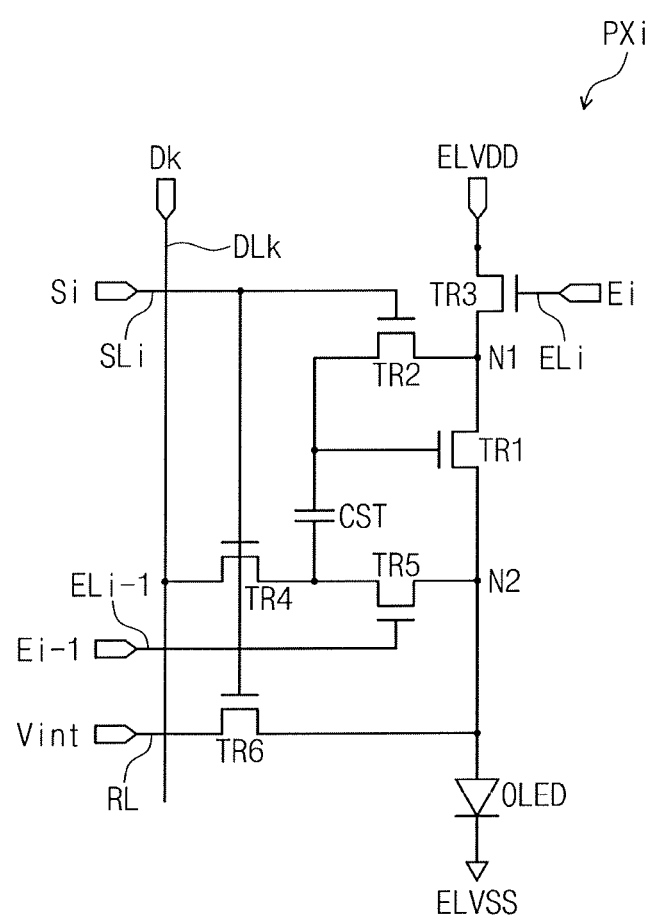
FIG. 2 is an equivalent circuit diagram illustrating a pixel according to an exemplary embodiment of the present invention.

FIG. 2 is an equivalent circuit diagram illustrating a pixel according to an exemplary embodiment of the present invention. FIG. 2 exemplarily illustrates an equivalent circuit diagram of an i-th pixel PXi connected to the k-th data line DLk, among the data lines DL1 to DLm.

The i-th pixel PXi includes an organic light emitting diode OLED and a pixel driving circuit for controlling the organic light emitting diode OLED. A pixel driving circuit may include six thin film transistors TR1 to TR6 and a capacitor CST. Hereinafter, the six thin film transistors TR1 to TR6 are exemplarily described as N-type thin film transistors. It is understood that the pixel driving circuit shown in FIG. 2 is merely exemplary, and the configuration of the pixel driving circuit shown in FIG. 2 may be modified as needed.

The pixel driving circuit may include a driving transistor and a control transistor. The driving transistor controls a driving current supplied to the organic light emitting diode OLED. According to an exemplary embodiment of the present invention, the driving transistor may be a first transistor TR1.

The output electrode of the first transistor TR1 is electrically connected to the organic light emitting diode OLED. The output electrode of the first transistor TR1 may directly contact the anode of the organic light emitting diode OLED or may be connected to the anode of the organic light emitting diode OLED through another transistor.

The control electrode of the control transistor may receive a control signal. A control signal applied to the i-th pixel PXi may include an i-th scan signal Si, a data signal Dk, an i−1-th light emitting control signal Ei−1, and the i-th light emitting control signal Ei.

According to an exemplary embodiment of the present invention, the control transistor may include the second to sixth transistors TR2 to TR6. However, the present invention is not limited to a control transistor which includes five thin film transistors (e.g., the second to sixth transistors TR2 to TR6), and the control transistor may include less than five or more than five thin film transistors.

A node between the output electrode of the second transistor TR2 and the input electrode of the first transistor TR1 may be a first node N1, and a node between the output electrode of the fifth transistor TR5 and the output electrode of the first transistor TR1 may be a second node N2.

The first transistor TR1 receives a power voltage ELVDD through the third transistor TR3, and includes an input electrode connected to the first node N1, a control electrode connected to a first electrode of the capacitor CST, and an output electrode connected to the organic light emitting diode OLED through the second node N2.

The second transistor TR2 includes a control electrode connected to the i-th scan line SLi, an input electrode, and an output electrode connected to the first node N1. The input electrode of the second transistor TR2 is connected to the control electrode of the first transistor TR1 and the first electrode of the capacitor CST.

The third transistor TR3 includes a control electrode connected to the i-th light emitting control line Eli, an input electrode connected to a power line PL, and an output electrode connected to the first node N1. The third transistor TR3 is turned on in response to the i-th light emitting control signal Ei.

The fourth transistor TR4 includes a control electrode connected to the i-th scan line SLi, an input electrode connected to the k-th data line DLk, and an output electrode. The output electrode of the fourth transistor TR4 is connected to a second electrode of the capacitor CST and the fifth transistor TR5. The fourth transistor TR4 is turned on in response to the i-th scan signal Si, and provides a data signal, which is received through the input electrode, to the capacitor CST.

The fifth transistor TR5 includes a control electrode connected to the i−1-th light emitting control line Ei−1, an input electrode, and an output electrode connected to the second node N2. The output electrode of the fifth transistor TR5 is connected to the second electrode of the capacitor CST and the output electrode of the fourth transistor TR4. The fifth transistor TR5 is turned on in response to the i−1th light emitting control signal Ei−1.

The sixth transistor TR6 includes a control electrode connected to the i-th scan line SLi, an input electrode connected to an initialization line RL, and an output electrode connected to the organic light emitting diode OLED. The sixth transistor TR6 is turned on in response to the i-th scan signal Si, and provides an initialization voltage Vint to the second node N2.

The equivalent circuit diagram shown in FIG. 2 may include P-type transistors. However, the present invention is not limited thereto. For example, a semiconductor device, according to an exemplary embodiment of the present invention may include various other kinds of transistors.

Figure 3:
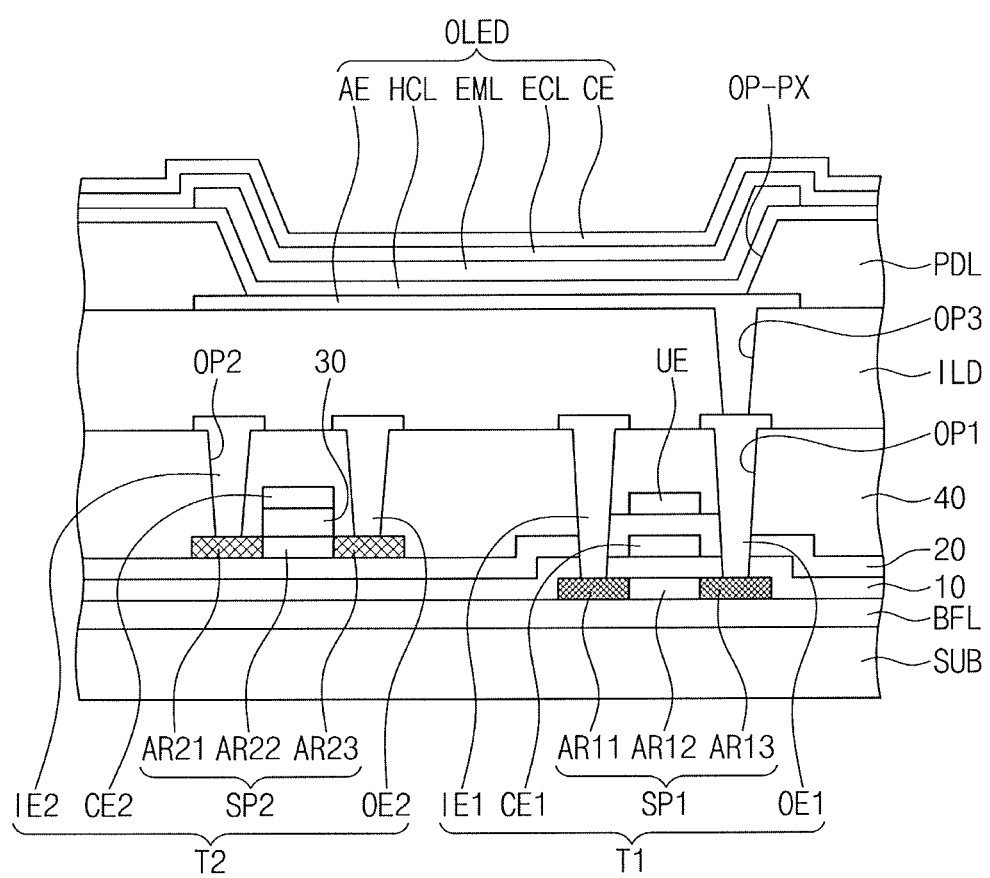
FIG. 3 is a sectional view illustrating a semiconductor device according to an exemplary embodiment of the present invention.

FIG. 3 is a sectional view illustrating a semiconductor device according to an exemplary embodiment of the present invention. FIG. 3 illustrates a partial sectional view of the display device of in FIG. 1.

As shown in FIG. 3, the display device includes a base substrate SUB, a first transistor T1, a second transistor T2, and an organic light emitting diode OLED. Each of the first and second transistors T1 and T2 may be any transistor of the pixel driving circuit shown in FIG. 2. For example, the first transistor T1 may correspond to the first transistor TR1 shown in FIG. 2 and the second transistor T2 may correspond to the fourth transistor TR4 shown in FIG. 2. However, this is exemplarily described, and the second transistor T2 may be any other transistor among the control transistors.

The first transistor T1, the second transistor T2, and the organic light emitting diode OLED are disposed on the upper surface of the base substrate SUB. The upper surface of the base substrate SUB is disposed on a plane formed by the first direction DR1 (see FIG. 1) and the second direction DR2 (see FIG. 2).

The first transistor T1 includes a first input electrode IE1, a first output electrode OE1, a first control electrode CE1, and a first semiconductor pattern SP1. The first transistor T1 may be a driving transistor connected to the organic light emitting diode OLED. The second transistor T2 includes a second input electrode IE2, a second output electrode OE2, a second control electrode CE2, and a second semiconductor pattern SP2. The second transistor T2 may be a control transistor for turning on a pixel PX.

The organic light emitting device OLED includes a lower electrode AE, a first charge control layer HCL, a light emitting layer EML, a second charge control layer ECL, and an upper electrode CE. In an exemplary embodiment of the present invention, the lower electrode AE, the first charge control layer HCL, the light emitting layer EML, the second charge control layer ECL, and the upper electrode CE may respectively correspond to an anode electrode AE, a hole control layer HCL, a light emitting layer EML, an electron control layer ECL, and a cathode electrode CE. However, this arrangement is merely exemplary, and the lower electrode AE, the first charge control layer HCL, the light emitting layer EML, the second charge control layer ECL, and the upper electrode CE may respectively be a cathode electrode, an electron control layer, a light emitting layer, a hole control layer, and an anode electrode.

In an exemplary embodiment of the present invention, a capacitor may be formed to overlap the first transistor TR1. For example, a capacitor may be formed by a first control electrode CE1 and an upper electrode UE. The first control electrode CE1 and the upper electrode UE may be disposed to overlap each other in a plan view and may form a predetermined electric field in an overlapping area. A capacitor formed by the first control electrode CE1 and the upper electrode UE may correspond to the capacitor CST of FIG. 2.

The first control electrode CE1 may be a component of the first transistor TR1 and an electrode of the capacitor CST, simultaneously. The capacitor CST may overlap the semiconductor pattern SP1.

The base substrate SUB may be a layer, a film, or a plate, where the first transistor T1, the second transistor T2, and the capacitor CST may be disposed. The base substrate 110 may include a plastic substrate, a glass substrate, and/or a metallic substrate. The plastic substrate may include acrylic resin, methacrylic resin, polyisoprene, vinyl resin, epoxy resin, urethane resin, cellulose resin, siloxane-based resin, polyimide-based resin, polyamide-based resin, and/or perylene resin.

A buffer layer BFL may be disposed between the upper surface of the base substrate SUB and the first transistor T1 and the second transistor T2. The buffer layer BFL may increase the bonding strength of the base substrate SUB and conductive patterns or semiconductor patterns. The buffer layer BFL may include an organic matter and/or an inorganic matter. In addition, a barrier layer for preventing a foreign material from entering may be further disposed on the upper surface of the base substrate SUB. The buffer layer BFL and the barrier layer may be included or omitted as needed.

The first semiconductor pattern SP1 is disposed on the buffer layer BFL. The first semiconductor pattern SP1 may include a crystalline semiconductor material. For example, the first semiconductor pattern SP1 may include a polycrystalline semiconductor material such as polycrystalline silicon.

The first semiconductor pattern SP1 may include a first area AR11 and a third area AR13, both of which include an impurity, and a second area AR12 adjacent to the first area AR11 and the third area AR13. The impurity may be a dopant. The first area AR1 is connected to the first input electrode IE1 and the third area AR13 is connected to the first output electrode OE1.

The second area AR12 may be disposed between the first area AR11 and the third area AR13, and overlap the first control electrode CE1 in a plan view. The second area AR12 may be a channel area of the first transistor T1.

The channel area of the first transistor T1 may include a polycrystalline semiconductor material. Accordingly, the first transistor T1 may have an increased mobility and function as a reliable driving element.

A first insulating layer 10 is disposed on the first semiconductor pattern SP1. The first insulating layer 10 may include an inorganic matter and/or an organic matter. For example, the first insulating layer 10 may include a silicon nitride and/or a silicon oxide.

The first insulating layer 10 may be disposed on the buffer layer BFL to cover at least a portion of the first semiconductor pattern SP1. However, this is merely exemplary, and the first insulating layer 10 may be an insulation pattern overlapping the second area AR12 in a plan view. The first insulating layer 10, according to an exemplary embodiment of the present invention, may have various shapes and may cover predetermined areas of the substrate SUB.

The first control electrode CE1 and a first capacitor electrode, may be disposed on the first insulating layer 10. The first control electrode CE1 and the first capacitor electrode may be disposed on the same layer.

The first control electrode CE1 overlaps at least the second area AR12. The first control electrode CE1 is spaced apart from the first semiconductor pattern SP1, with the first insulating layer 10 disposed therebetween. The first control electrode CE1 controls a charge transfer in the second area AR12, that becomes a channel area. In an exemplary embodiment of the present invention, the first control electrode CE1 is an electrode of a capacitor.

A second insulating layer 20 is disposed on the first control electrode CE1 and the first capacitor electrode CPE1. The second insulating layer 20 is disposed on the first insulating layer 10 to cover the first control electrode CE1 and the first capacitor electrode CPE1. The second insulating layer 20 may include an organic matter and/or an inorganic matter.

An upper electrode UE may be disposed on the second insulating layer 20. The upper electrode UE may be disposed to overlap the first control electrode CE1 in a plan view. The upper electrode UE may be another electrode of a capacitor formed by the first control electrode CE1 or the first capacitor electrode. The upper electrode UE may face the first control electrode CE1 with the second insulating layer 20 disposed therebetween.

The second insulating layer 20 may be a dielectric layer of a capacitor formed by the first control electrode CE1 and the upper electrode UE. The first control electrode CE1 forms an electric field with an overlapping electrode (e.g., the upper electrode UE), view with the second insulating layer 20 disposed therebetween. Accordingly, the electric field may be affected by a thickness of the second insulating layer 20 and a material included in the second insulating layer 20.

A second semiconductor pattern SP2 is disposed on the second insulating layer 20. The second semiconductor pattern SP2 may include an oxide semiconductor. For example, the oxide semiconductor may include a metal oxide of Zn, In, Ga, Sn, and/or Ti or a compound of a metal of Zn, In, Ga, Sn, and/or Ti and/or an oxide thereof.

In addition, the second semiconductor pattern SP2 may include a crystallized oxide semiconductor. The crystal of the oxide semiconductor may have an orientation in a vertical direction.

The second semiconductor pattern SP2 may include a first area AR21 and a third area AR23, both of which include an impurity, and a second area AR22 adjacent to the first area AR21 and the third area AR23. The first area AR21 and the third area AR23 are spaced apart from each other with the second area AR22 disposed therebetween.

The second area AR22 may be a channel area of the second transistor T2. In the second semiconductor pattern SP2, the impurity may be reduced metal materials. The first area AR21 and the third area AR23 may include metal materials reduced from a metal oxide that is included in the second area AR22. Accordingly, the second transistor T2 may decrease leakage of current. Thus, the second transistor T2 may function as a switching element with increased on-off characteristics.

A third insulating layer 30 is disposed on the second insulating layer 20. The third insulating layer 30 includes an inorganic matter and/or an organic matter. In an exemplary embodiment of the present invention, the third insulating layer 30 may be an insulation pattern (hereinafter referred to as an insulation pattern 30). The insulation pattern 30 overlaps the second control electrode CE2 in a plan view. The insulation pattern 30 covers the second area AR22 of the second semiconductor pattern SP2 and exposes the first area AR21 and the third area AR23.

A side of the insulation pattern 30 and a corresponding side of the second control electrode CE2 may be aligned along one line. A boundary between the first area AR21 and the second area AR22 and a boundary between the second area AR22 and the third area AR23 may be aligned along a side of the insulation pattern 30. The insulation pattern 30 and the second control electrode CE2 may have the same shape and/or size in a plan view.

The second control electrode CE2 is disposed on the insulation pattern 30. The scan lines SL1 to SLn (see FIG. 1) may be disposed on the same layer as the second control electrode CE2. However, the present invention is not limited thereto, and the scan lines SL1 to SLn may also be disposed on other layers.

A fourth insulating layer 40 is disposed on the second control electrode CE2 and the upper electrode UE. The fourth insulating layer 40 includes an inorganic matter and/or an organic matter.

The first input electrode IE1, the first output electrode OE1, the second input electrode IE2, and the second output electrode OE2 are each disposed on the fourth insulating layer 40. Each of the first input electrode IE1, the first output electrode OE1, the second input electrode IE2, and the second output electrode OE2 may penetrate at least a portion of the first to fourth insulating layers 10, 20, 30, and 40 to be connected to the first semiconductor pattern SP1 or the second semiconductor pattern SP2.

The first input electrode IE1 and the first output electrode OE1 are connected to the first area AR11 and the third area AR13 of the first semiconductor pattern SP1, respectively, through first through holes OP1 penetrating the first to fourth insulating layers 10, 20, 30, and 40. The second input electrode IE2 and the second output electrode OE2 are connected to the first area AR21 and the third area AR23 of the second semiconductor pattern SP2, respectively, through second through holes OP2 penetrating the fourth insulating layers 40. The data lines DL1 to DLm may be disposed on the same layer as the second input electrode IE2 and the second output electrode OE2. Accordingly, the data lines DL1 to DLm may be directly disposed on the upper surface of the fourth insulating layer 40.

An interlayer ILD is disposed on the fourth insulating layer 40. The interlayer ILD includes an inorganic matter and/or an organic matter. A third through hole OP3 may penetrate the interlayer ILD. The third through hole OP3 may overlap the first output electrode OE1.

A first electrode AE is disposed on the interlayer ILD. The first electrode AE is connected to the first output electrode OE1 of the first transistor T1 through the third through hole OP3. A connection part of the first output electrode OE1 and the first electrode AE may correspond to the second node N2 (see FIG. 2).

A pixel definition layer PDL is disposed on the interlayer ILD. The pixel definition layer PDL may include an inorganic layer and/or an organic layer. An opening part OP-PX is formed in the pixel definition layer PDL. The opening part OP-PX exposes at least a portion of the lower electrode AE.

The first charge control layer HCL, the light emitting layer EML, the second charge control layer ECL, and the second electrode CE are sequentially stacked on the first electrode AE. The light emitting layer EML may be a light emitting pattern overlapping the opening part OP-PX. The organic light emitting diode OLED generates light from the light emitting layer EML by using a voltage difference between the first electrode AE and the second electrode CE. A display device, according to an exemplary embodiment of the present invention, may further include an organic layer and/or an inorganic layer disposed on the second electrode CE.

Figure 4A:
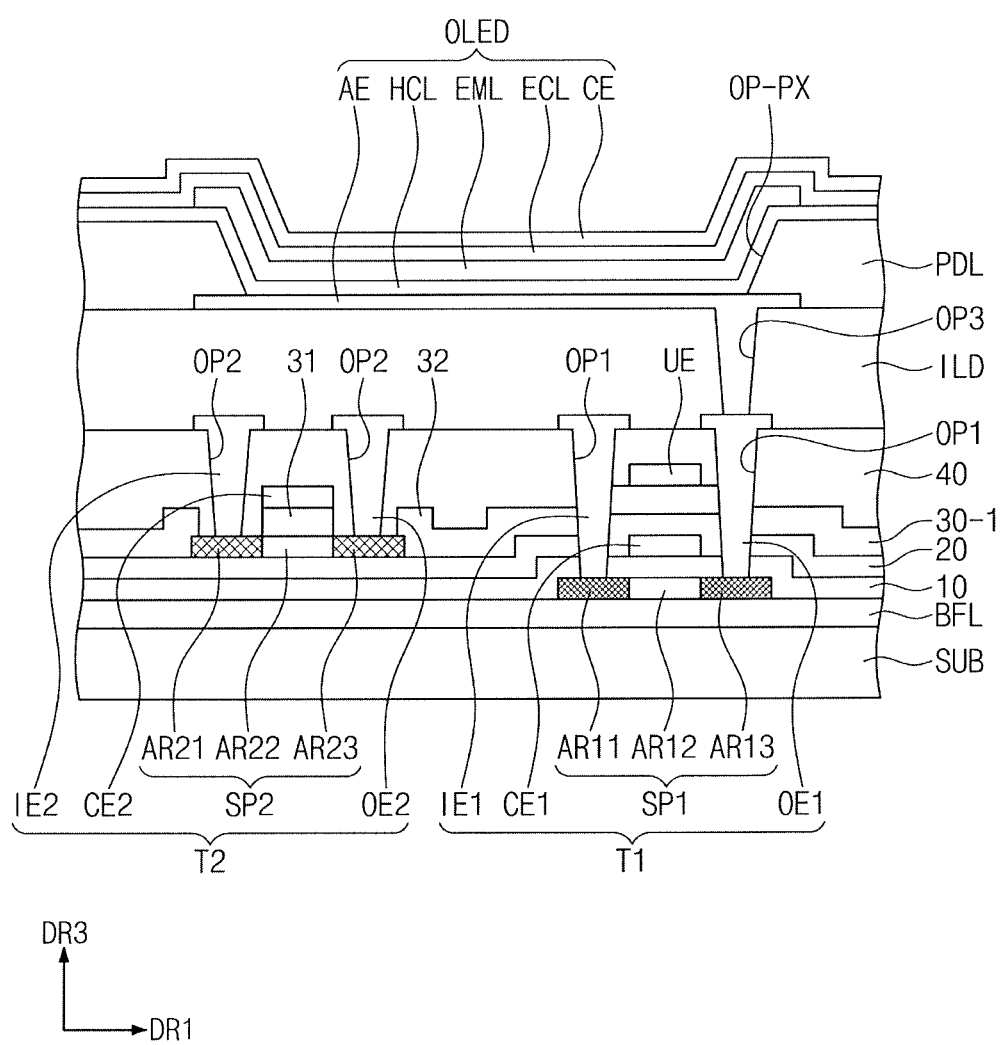
FIG. 4A is a sectional view illustrating a semiconductor device according to an exemplary embodiment of the present invention.
Figure 4B:
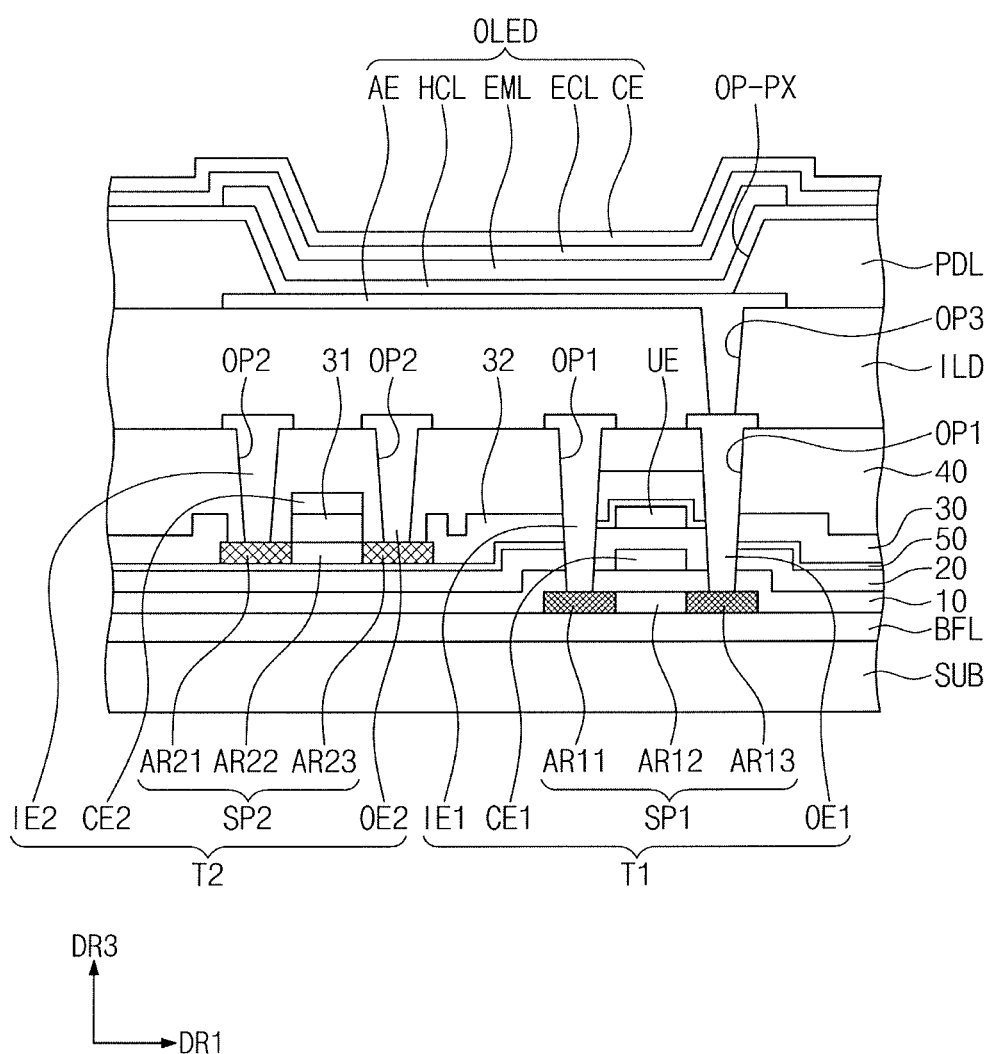
FIG. 4B is a sectional view illustrating a semiconductor device according to an exemplary embodiment of the present invention.
Figure 4C:
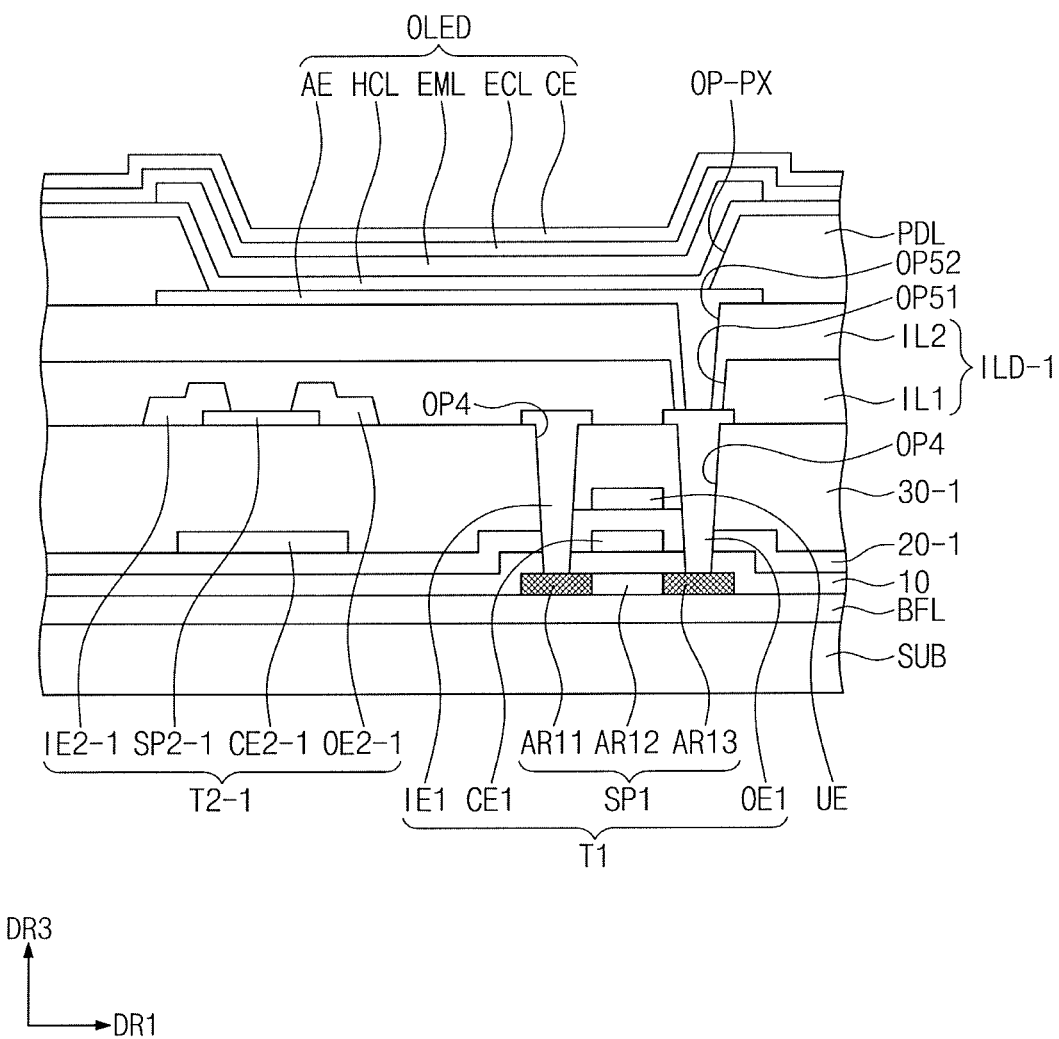
FIG. 4C is a sectional view illustrating a semiconductor device according to an exemplary embodiment of the present invention.

FIG. 4A is a sectional view illustrating a semiconductor device according to an exemplary embodiment of the present invention. FIG. 4B is a sectional view illustrating a semiconductor device according to an exemplary embodiment of the present invention. FIG. 4C is a sectional view illustrating a semiconductor device according to an exemplary embodiment of the present invention.

A semiconductor device, according to an exemplary embodiment of the present invention, may include transistors having various structures.

As shown in FIG. 4A, the semiconductor device may include a first transistor T1, a second transistor T2, and an organic light emitting diode OLED. The first transistor T1, the second transistor T2, and the organic light emitting diode OLED may respectively correspond to the first transistor T1, the second transistor T2, and the organic light emitting diode OLED of FIG. 3.

The semiconductor device may include a third insulating layer 30-1. The third insulating layer 30-1 may be disposed between the second insulating layer 20 and the fourth insulating layer 40. The third insulating layer 30-1 overlaps the first control electrode CE1 and exposes at least a portion of the second semiconductor pattern SP2.

The third insulating layer 30-1 includes a first insulation pattern 31 for covering the second area AR22 of the second semiconductor pattern SP2 and a second insulation pattern 32 for exposing at least a portion of the first area AR21 and the third area AR23. The first insulation pattern 31 and the second insulation pattern 32 may be formed as an opening part for exposing each of the first area AR21 and the third area AR23 of the second semiconductor pattern SP2.

The first insulation pattern 31 overlaps the second control electrode CE2. The first insulation pattern 31 may be disposed between the second control electrode CE2 and the second semiconductor pattern SP2. The first insulation pattern 31 may correspond to the insulation pattern 30 (see FIG. 3).

The second insulation pattern 32 overlaps the first control electrode CE1. The second insulation pattern 32 may be disposed between the first control electrode CE1 and the upper electrode UE. Since the third insulating layer 30-1 includes the first insulation pattern 31 and the second insulation pattern 32, the third insulating layer 30-1 exposes the first area AR21 and the third area AR23 of the second semiconductor pattern SP2. In addition, the third insulating layer 30-1 overlaps the second area AR22 of the second semiconductor pattern SP2 and the first semiconductor pattern SP1.

In addition, in an exemplary embodiment of the present invention, the second insulating layer 20 and the third insulating layer 30-1 may be disposed between the first control electrode CE1 and the upper electrode UE, when first control electrode CE1 and the upper electrode UE form a capacitor. Accordingly, an electric field that the first control electrode CE1 and the upper electrode UE generate may be affected by the thickness and materials of each of the second insulating layer 20 and the third insulating layer 30-1.

As shown in FIG. 4B, compared to the semiconductor device shown in FIG. 3, a semiconductor may further include a third insulating layer 30 and a fifth insulating layer 50. The third insulating layer 30 includes a first insulation pattern 31 and a second insulation pattern 32. The first insulation pattern 31 corresponds to the insulation pattern 30 shown in FIG. 3.

The second insulation pattern 32 may be disposed on the upper electrode UE. Accordingly, the second insulating layer 20 may be disposed between the upper electrode UE and the first control electrode CE1. A capacitor formed by the upper electrode UE and the first control electrode CE1 may be relatively less affected by the third insulating layer 30.

The fifth insulating layer 50 may be disposed between the second insulating layer 20 and the third insulating layer 30. The fifth insulating layer 50 may be disposed at a lower side of the second semiconductor pattern SP2. Accordingly, the second transistor T2 may be disposed on the fifth insulating layer 50. The fifth insulating layer 50 covers the upper electrode UE.

In an exemplary embodiment of the present invention, the fifth insulating layer 50 may be thinner than the third insulating layer 30. The fifth insulating layer 50 may provide a surface in a state different from that of the second insulating layer 20 to the second semiconductor pattern SP2 to facilitate the formation of the second semiconductor pattern SP2. Additionally, the fifth insulating layer 50 may protect the upper electrode UE from a layer formed on the upper electrode UE.

As shown in FIG. 4C, the semiconductor device may include a first transistor T1, a second transistor T2-1, and an organic light emitting diode OLED. The first transistor T1 may correspond to the first transistor T1 (see FIG. 3) except that first input electrode IE1 and the first output electrode OE1 are disposed on the third insulating layer 30-1 and are connected to the first semiconductor pattern SP1 by the through part OP4, penetrating the first insulating layer 10, a second insulating layer 20-1, and the third insulating layer 30-1.

The second transistor T2-1 may include a second semiconductor pattern SP2-1 disposed on the second control electrode CE2-1. For example, the second transistor T2-1 may include the second control electrode CE2-1 disposed on the second insulating layer 20-1, the second semiconductor pattern SP2-1 disposed on the third insulating layer 30-1, a second input electrode IE2-1 disposed on the third insulating layer 30-1, and a second output electrode OE2-1. The second control electrode CE2-1 may be disposed between the second insulating layer 20-1 and the third insulating layer 30-1 The second control electrode CE2-1 may be disposed on the same layer as the upper electrode UE.

The second semiconductor pattern SP2-1 may be disposed on the second control electrode CE2-1. The second semiconductor pattern SP2-1 overlaps the second control electrode CE2-1 in a plan view. The second input electrode IE2-1 and the second output electrode OE2-1 are disposed on the third insulating layer 30-1 so that each partially covers the second semiconductor pattern SP2-1. The second transistor T2-1 may further include an ohmic contact layer in an area contacting each of the second input electrode IE2-1 and the second output electrode OE2-1 in the second semiconductor pattern SP2-1.

The semiconductor device may include an interlayer ILD-1 including a first layer IL1 and a second layer IL2. A through hole OP51 penetrating the first layer IL1 is formed in the first layer IL1. The through hole OP51 is formed in an area overlapping the first output electrode OE1 of the first transistor T1-2.

The second layer IL2 is disposed on the first layer IL1. The second layer IL2 fills the through hole OP51, penetrating the first layer ILL A through hole OP52 may penetrate the second layer IL2. The through hole OP52 is disposed in an area overlapping the through hole OP51 of the first layer IL1. The through hole OP52 of the second layer IL2 may pass through the through hole OP51 of the first layer IL1. The lower electrode AE may be disposed on the interlayer ILD-1 to be connected to the first output electrode OE1 through the through hole OP52 of the second layer IL2.

In relation to a semiconductor device, according to an exemplary embodiment of the present invention, the second transistor T2-1 may have a structure where the second semiconductor pattern SP2-1 is disposed on the second control electrode CE2-1. Accordingly, the second input electrode IE2-1 and the second output electrode OE2-1 may directly contact the second semiconductor pattern SP2-1 without the need for an additional through hole. A semiconductor device, according to an exemplary embodiment of the present invention, may implement an adaptable pixel driving circuit while including relatively few insulating layers.

Figure 5A:
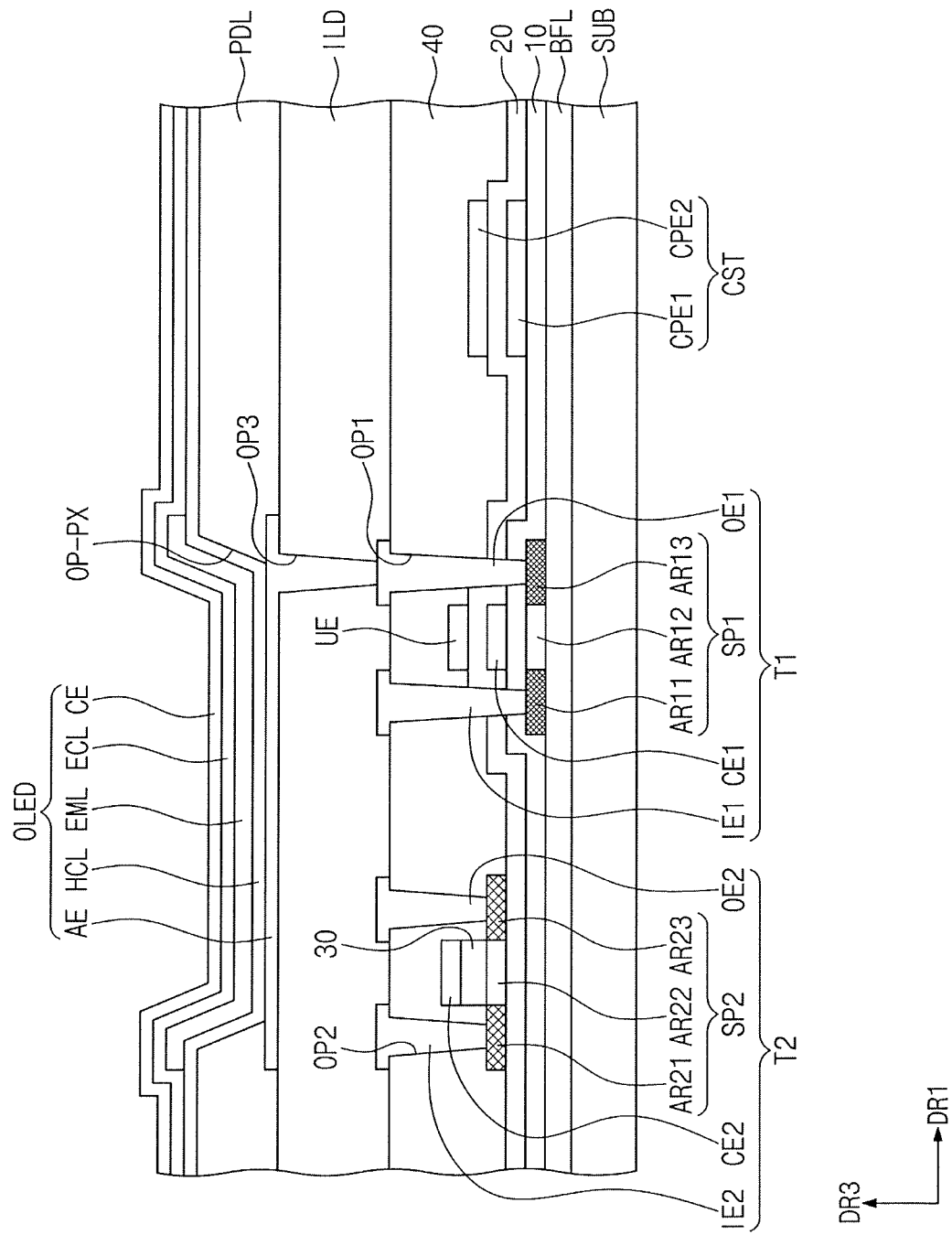
FIG. 5A is a sectional view illustrating a semiconductor device according to an exemplary embodiment of the present invention.
Figure 5B:
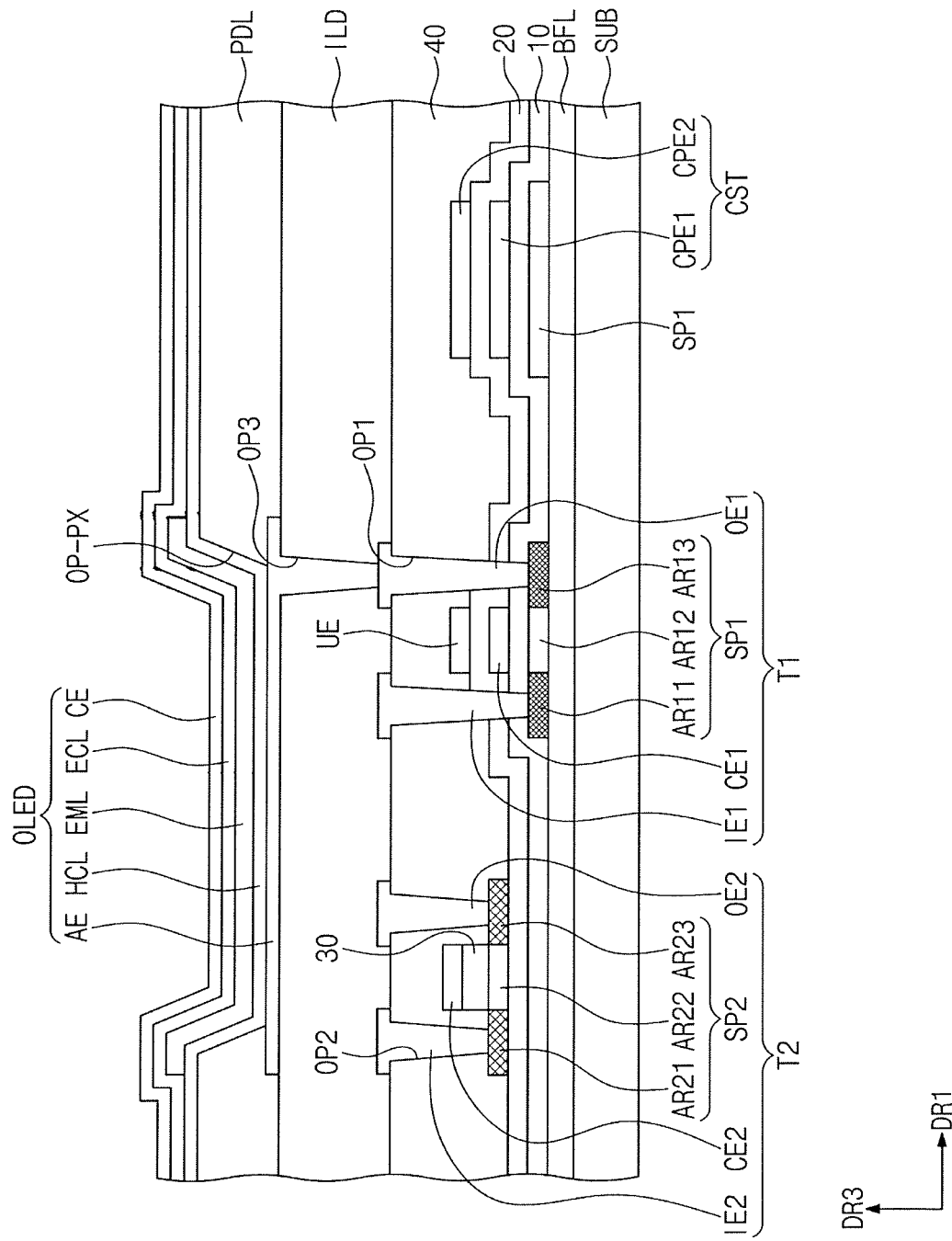
FIG. 5B is a sectional view illustrating a semiconductor device according to an exemplary embodiment of the present invention.

FIG. 5A is a sectional view illustrating a semiconductor device according to an exemplary embodiment of the present invention. FIG. 5B is a sectional view illustrating a semiconductor device according to an exemplary embodiment of the present invention. As shown in FIGS. 5A and 5B, the capacitor CST partially extends so as not to overlap the first transistor T1.

As shown in FIG. 5A, a portion of the capacitor CST might not overlap the first semiconductor pattern SP1. The first capacitor electrode CPE1 may be a portion of an integral electrode pattern connected to the upper electrode UE and the second capacitor electrode CPE2 may be a portion of an integral electrode pattern connected to the first control electrode CE1. For example, the first capacitor electrode CPE1 may be a portion of the upper electrode UE and the second capacitor electrode CPE2 may be a portion of the first control electrode CE1.

Alternatively, as shown in FIG. 5B, a portion of the first semiconductor pattern SP1 may extend to an area that does not overlap the first transistor T1. Each of the first capacitor electrode CPE1 and the second capacitor electrode CPE2 may entirely overlap the first semiconductor pattern SP1. The first semiconductor pattern SP1, overlapping the capacitor CST, may include the same material as the second area AR12 of the first semiconductor pattern SP1.

A semiconductor device, according to an exemplary embodiment of the present invention, may include the capacitor CST that forms an electric field in an area extending to the outside of the first transistor T1 in a plan view. For example, a portion of the upper electrode UE may overlap the second area AR12 of the first semiconductor pattern SP1 and another portion of the upper electrode UE may extend to be disposed outside the first transistor T1. Additionally, a portion of the first control electrode CE1 may overlap the second area AR12 of the first semiconductor pattern SP1 and another portion of the first control electrode CE1 may extend to be disposed outside the first transistor T1. Accordingly, since an electric field is formed in an area other than the second area AR12, a large area may be used to generate the capacitance of the capacitor CST.

Figure 6:
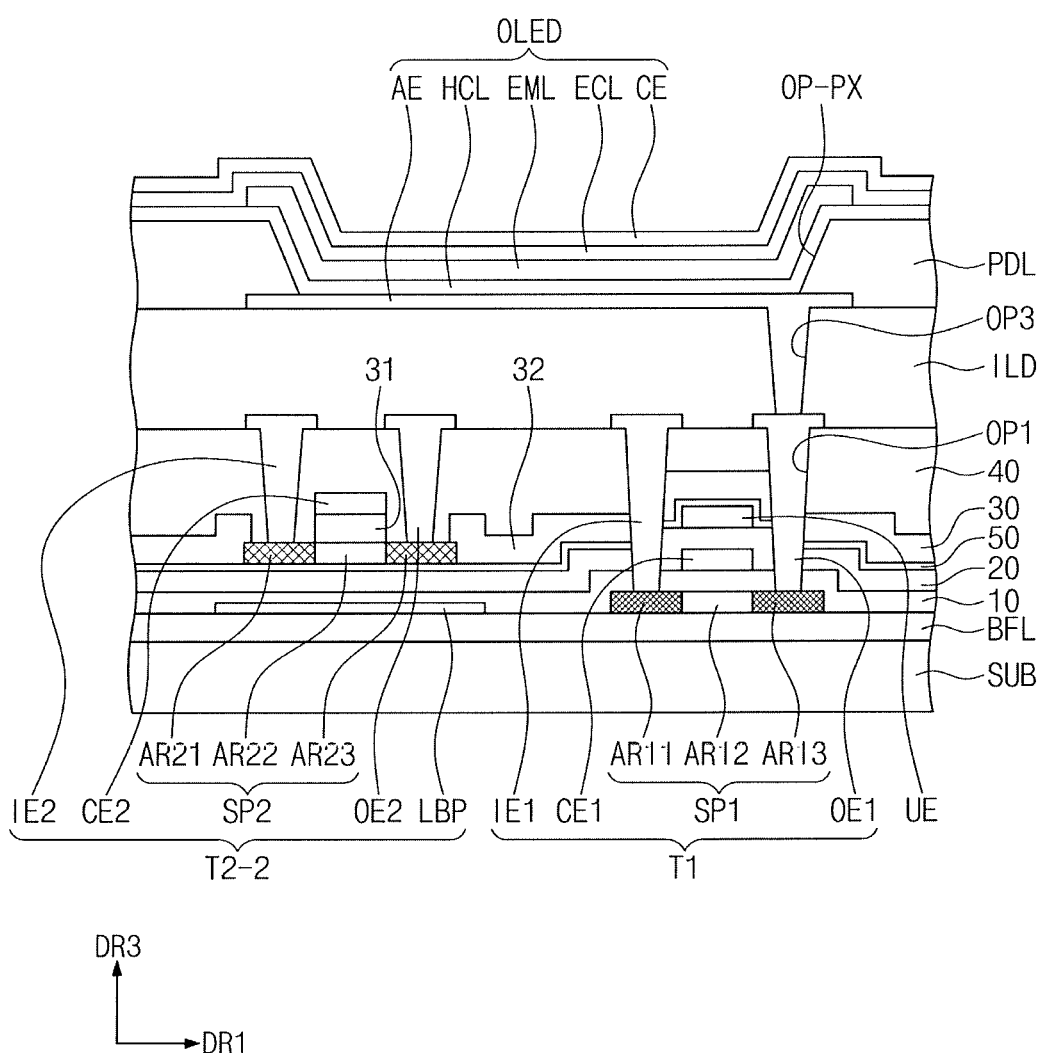
FIG. 6 is a sectional view illustrating a semiconductor device according to an exemplary embodiment of the present invention.
Figure 7A:
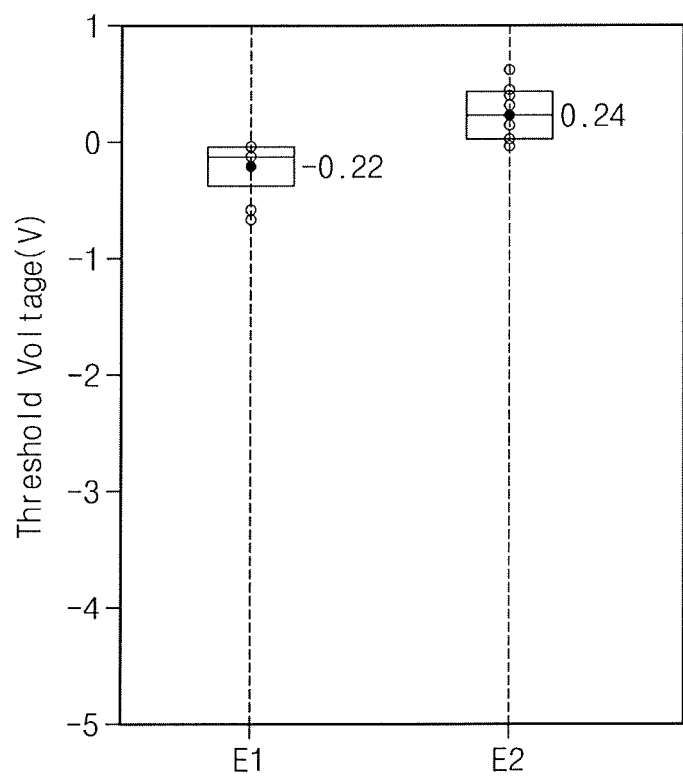
FIG. 7A is a graph illustrating a threshold voltage of a semiconductor device according to an exemplary embodiment of the present invention.
Figure 7B:
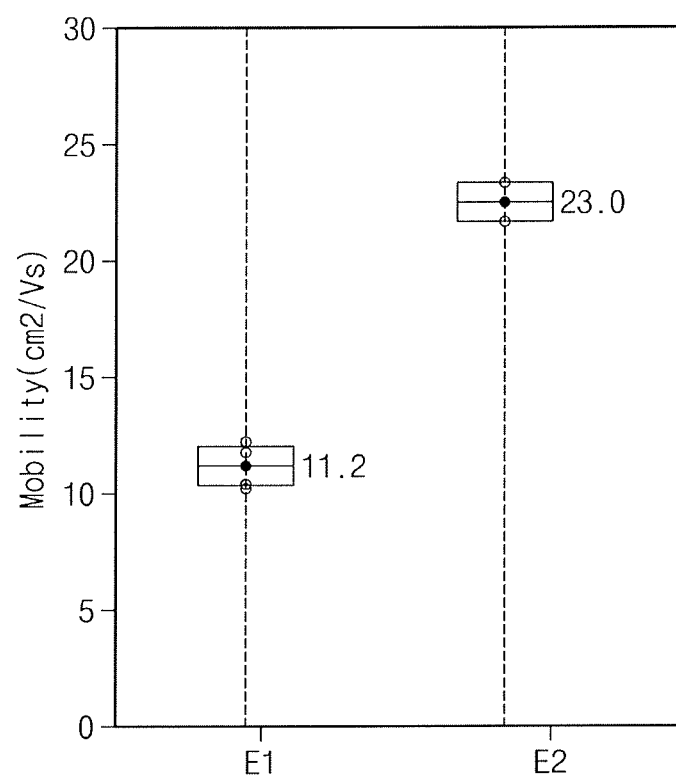
FIG. 7B is a graph illustrating a mobility of a semiconductor device according to an exemplary embodiment of the present invention.

FIG. 6 is a sectional view illustrating a semiconductor device according to an exemplary embodiment of the present invention. FIG. 7A is a graph illustrating a threshold voltage of a semiconductor device according to an exemplary embodiment of the present invention. FIG. 7B is a graph illustrating a mobility of a semiconductor device according to an exemplary embodiment of the present invention.

The semiconductor device shown in FIG. 6 includes a first transistor T1, a second transistor T2-2, a capacitor, and an organic light emitting diode OLED. The first transistor T1 and the organic light emitting diode OLED may respectively correspond to the first transistor T1 and the organic light emitting diode OLED shown in FIG. 4B. Additionally, the second transistor T2-2 may be identical to the second transistor T2 shown in FIG. 4B except for a light blocking pattern LBP.

FIGS. 7A and 7B illustrate each threshold voltage and carrier mobility of a first embodiment E1, corresponding to the second transistor T2 shown in FIG. 4B, and a second embodiment E2, corresponding to the second transistor T2-2 shown in FIG. 6. The first embodiment E1 corresponds to a transistor including a second control electrode CE2 and the second embodiment E2 corresponds to a transistor including the second control electrode CE2 and the light blocking pattern LBP.

As shown in FIG. 6, the second transistor T2-2 may further include the light blocking pattern LBP. The light blocking pattern LBP is disposed between the buffer layer BFL and the first insulating layer 10. The light blocking pattern LBP may include a material that absorbs light and/or a reflective material. The light blocking pattern LBP may be disposed at a lower part of the second semiconductor pattern SP2 to prevent external light from affecting the second semiconductor pattern SP2.

In addition, the light blocking pattern LBP may include the same material as the first semiconductor pattern SP1. For example, the light blocking pattern LBP may include a crystalline semiconductor. Accordingly, the light blocking pattern LBP may be formed simultaneously with the first semiconductor pattern SP1 so that the second transistor may be formed to have T2-2 various structures without using an additional process.

The light blocking pattern LBP may serve as a control electrode for controlling carrier mobility in a channel area of the second semiconductor pattern SP2. Accordingly, the second transistor T2-2 may include a plurality of control electrodes.

Referring to FIGS. 6 and 7A, there is a difference in threshold voltage Vth between the first embodiment E1, corresponding to the second transistor T2 including a single control electrode CE2, and a second embodiment E2, corresponding to the second transistor T2-2 including a plurality of control electrodes (e.g., the control electrode CE2 and the second semiconductor pattern SP2). The second embodiment E2 has a relatively higher threshold voltage compared to the first embodiment E1.

FIG. 6A shows that the first embodiment E1 has a threshold voltage of about −0.22 V and the second embodiment E2 has a threshold voltage of about 0.24 V. Both the first embodiment E1 and the second embodiment E2 have lower threshold voltages than about 1 V. Accordingly, the first embodiment E1 and the second embodiment E2 may be driven by a low driving voltage.

The second embodiment E2 has a higher threshold voltage compared to the first embodiment E1. In the case of the first embodiment E1, since a threshold voltage has a negative value, a micro current may flow in an off state. The semiconductor device of the second embodiment E2 may be driven in low-power drive and may have a small or no current leakage, which may occur in an off state as a threshold voltage is lowered.

Referring to FIGS. 6 and 7B, there is a difference in carrier mobility between a first embodiment E1 including single control electrode CE2 and a second embodiment E2 including a plurality of control electrodes. For example, the second embodiment E2 has a higher carrier mobility compared to the first embodiment E1. Accordingly, the second embodiment E2 has increased current mobility characteristics under the same driving voltage compared to the first embodiment E1.

A semiconductor device, according to an exemplary embodiment of the present invention, includes the light blocking pattern LBP having the same material as the first semiconductor pattern SP1. Accordingly, the second transistor T2-2, including a plurality of control electrodes, may be implemented. Accordingly, the second transistor T2-2 may serve as a control transistor having increased stability and reliability.

Figure 8A:
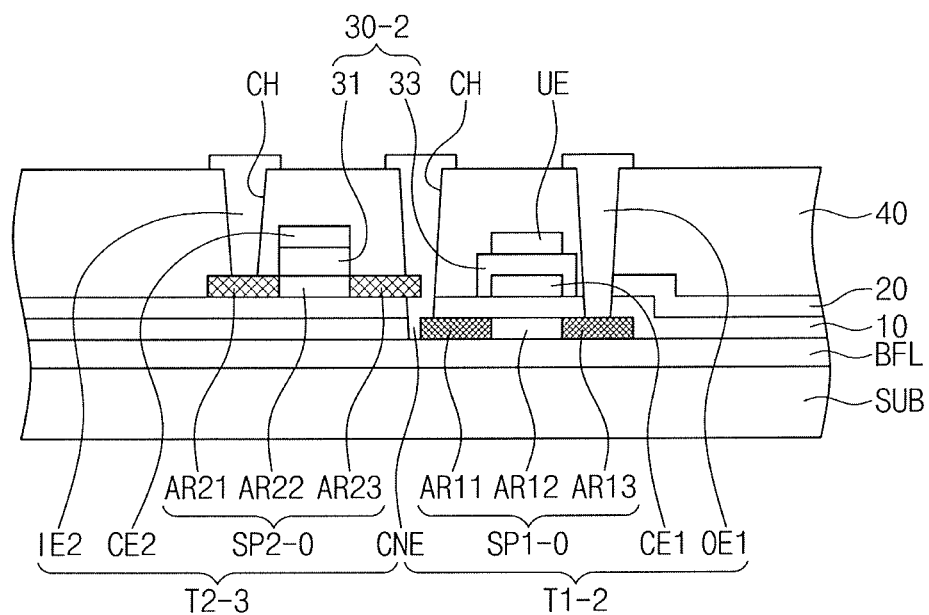
FIG. 8A is a sectional view illustrating a semiconductor device according to an exemplary embodiment of the present invention.
Figure 8B:
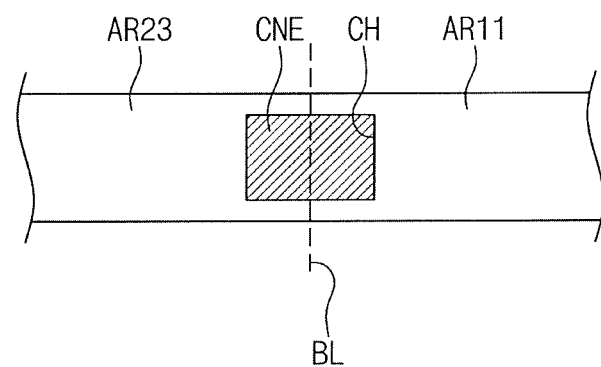
FIG. 8B is a plan view illustrating a portion of the semiconductor device shown in FIG. 8A, according to an exemplary embodiment of the present invention.

FIG. 8A is a sectional view of a semiconductor device according to an embodiment of the present invention. FIG. 8B is a plan view illustrating a portion of the semiconductor device shown in FIG. 8A, according to an exemplary embodiment of the present invention.

As shown in FIG. 8A, the semiconductor device may include a first transistor T1-2 and a second transistor T2-3. The first transistor T1-2 includes a first semiconductor pattern SP1-O, a first control electrode CE1, a first output electrode OE1, and a connection electrode CNE. The second transistor T2-3 includes a second semiconductor pattern SP2-O, a second control electrode CE2, a second input electrode IE2, and the connection electrode CNE.

The first transistor T1-2 and the second transistor T2-3 may be connected to each other through the connection electrode CNE. The connection electrode CNE serve as the input electrode of the first transistor T1-2 and the output electrode of the second transistor T2-3 at the same time.

The first semiconductor pattern SP1-O and the second semiconductor pattern SP2-O are disposed on different layers. The connection electrode CNE may be connected to the first area AR11 of the first semiconductor pattern SP1-O and the third area AR23 of the second semiconductor pattern SP2-O. The connection electrode CNE penetrates at least a portion of the second semiconductor pattern SP2-O. The connection electrode CNE is connected to the first semiconductor pattern SP1-O and the second semiconductor pattern SP2-O, disposed on different layers, through a through hole CH. The through hole CH penetrates first to fourth insulating layers 10, 20, 30-2, and 40.

As shown in FIG. 8B, end parts of the first semiconductor pattern SP1-O and the second semiconductor pattern SP2-O may be aligned along a predetermined line BL in a plan view. Accordingly, degree of integration between the first transistor TR1-2 and the second transistor TR2-3 may be increased and electrical issues that may occur by overlapping the first semiconductor pattern SP1-O with the second semiconductor pattern SP2-O may be prevented.

The through hole CH overlaps the first area AR11 of the first semiconductor pattern SP1-O and the third area AR23 of the second semiconductor pattern SP2-O in a plan view. The connection electrode CNE connects adjacent two transistors T1-2 and T2-3 through one through hole CH. Accordingly, an area occupied by the connection electrode CNE may be reduced and a contact area for connecting the two transistors T1-2 and T2-3 may be reduced. Accordingly, a semiconductor device, according to an exemplary embodiment of the present invention, may provide a highly-integrated (e.g., condensed) circuit. A high-resolution display device may be implemented by using a semiconductor device, according to an exemplary embodiment of the present invention.

The through hole CH may be formed by penetrating at least the second semiconductor pattern SP2-O, among the first semiconductor pattern SP1-O and the second semiconductor pattern SP2-O. The third area AR23 in the second semiconductor pattern SP2-O may also undergo a reduction process by an etching gas provided from an etching process for forming the through hole CH. Accordingly, the closer to the through hole CH, the higher the ratio of a reduced metal in the third area AR23.

The through hole CH may be formed to penetrate the first semiconductor pattern SP1-O. Accordingly, the closer to the through hole CH, the higher the ratio of a reduced metal in the first area AR11.

As a semiconductor device, according to an exemplary embodiment of the present invention, includes the first transistor T1-2 and the second transistor T2-3 connected to each other through the connection electrode CNE, connection characteristics between the first semiconductor pattern SP1-O and the connection electrode CNE and connection characteristics between the second semiconductor pattern SP2-O and the connection electrode CNE may be increased.

The first transistor T1-2 and the second transistor T2-3 may be disposed adjacent to each other and applied to various transistors connectable to each other. For example, the connection electrode CNE may correspond to the first node N1 (see FIG. 2) or the second node N2 (see FIG. 2). For example, the first transistor T1-2 may correspond to the first transistor TR1 (see FIG. 2) and the second transistor T2-3 may correspond to the second transistor TR2 (see FIG. 2). Alternatively, the first transistor T1-2 may correspond to the first transistor TR1 (see FIG. 2) and the second transistor T2-3 may correspond to the fifth transistor TR5 (see FIG. 2). However, this is merely exemplary, and the first transistor T1-2 and the second transistor T2-3 may be applied to various adjacent transistors, according to exemplary embodiments of the present invention.

Figure 9A:
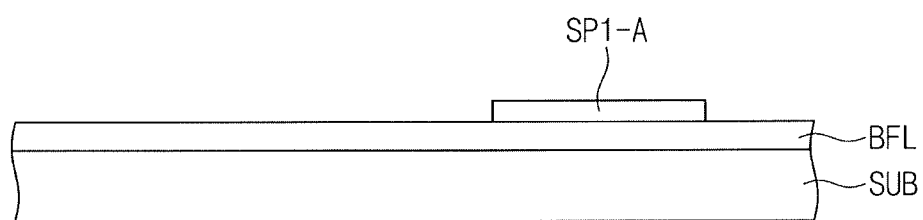
FIGS. 9A to 9N are sectional views illustrating a semiconductor device manufacturing method according to an exemplary embodiment of the present invention.
Figure 9B:
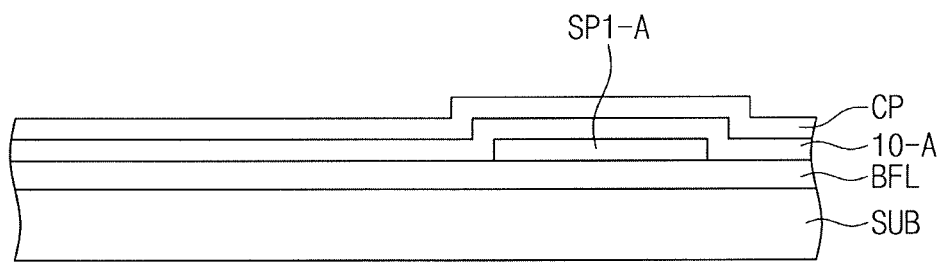
Figure 9C:
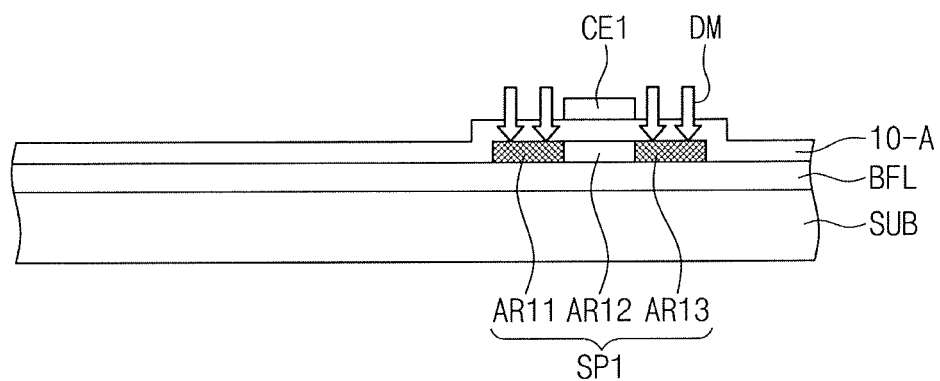
Figure 9D:
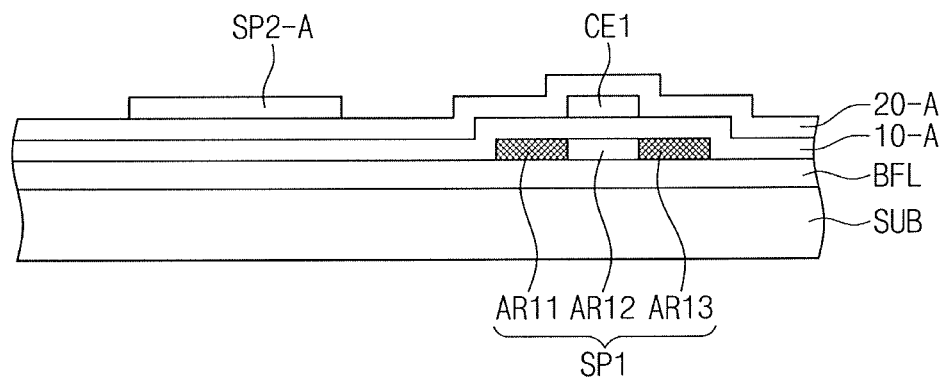
Figure 9E:
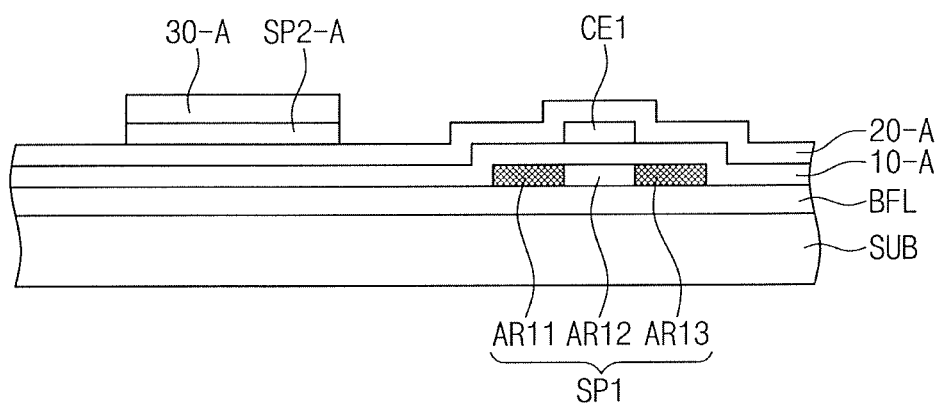
Figure 9F:
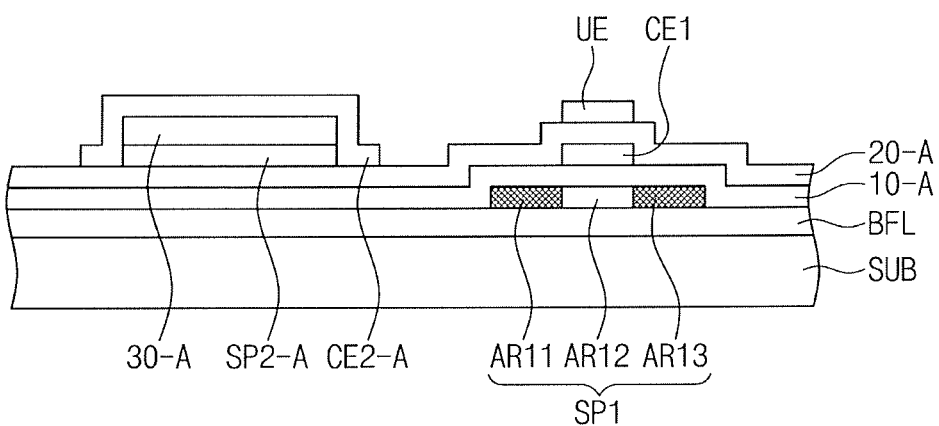
Figure 9G:
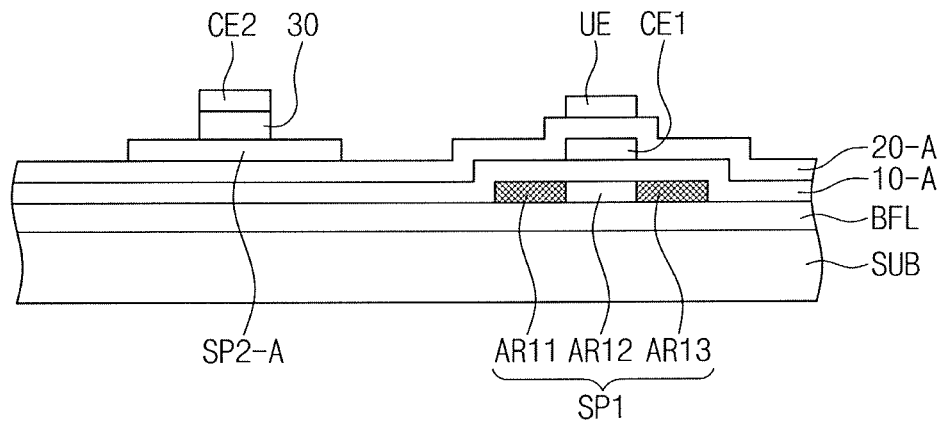
Figure 9H:
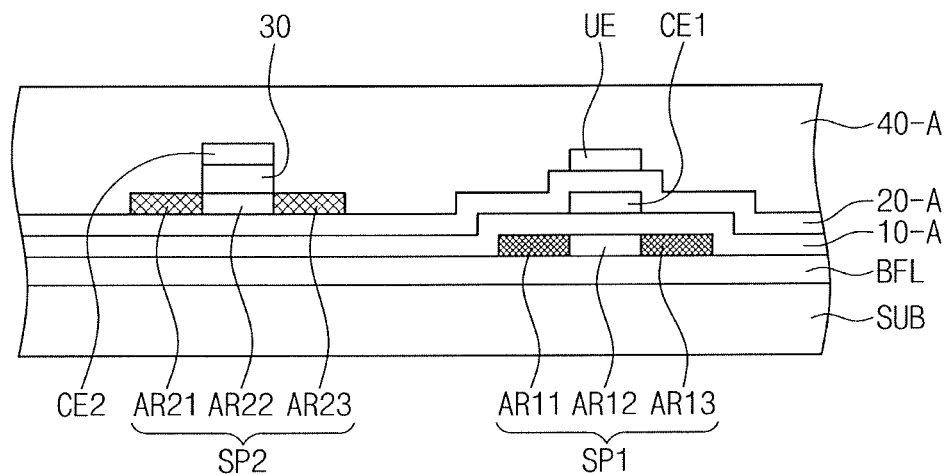
Figure 9I:
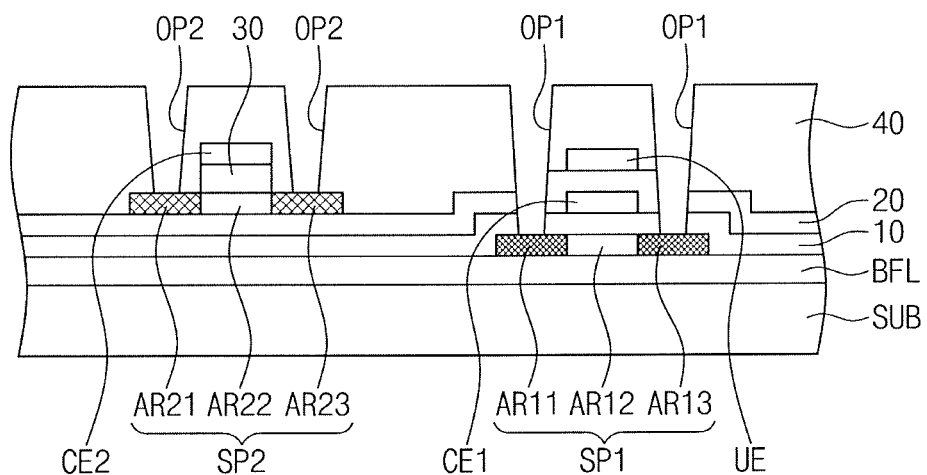
Figure 9J:
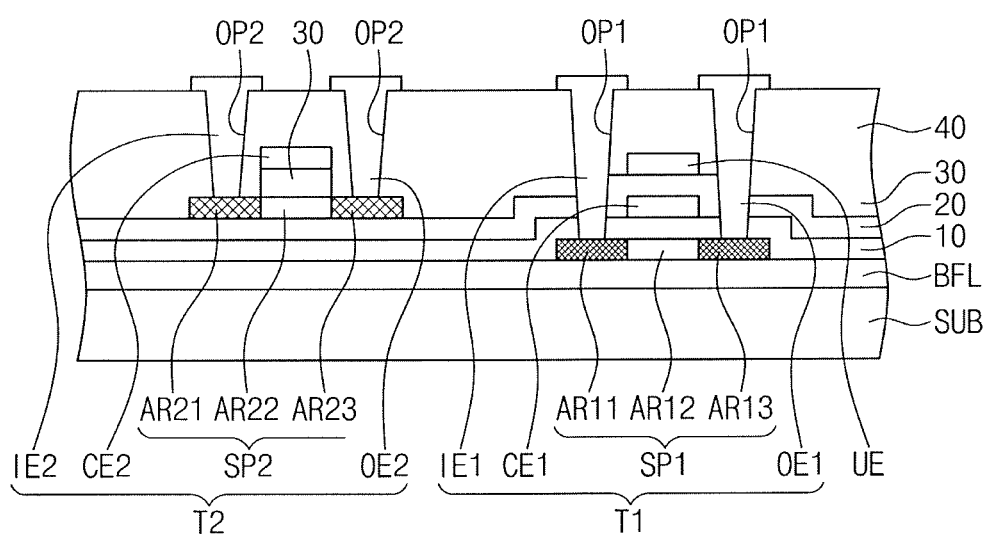
Figure 9K:
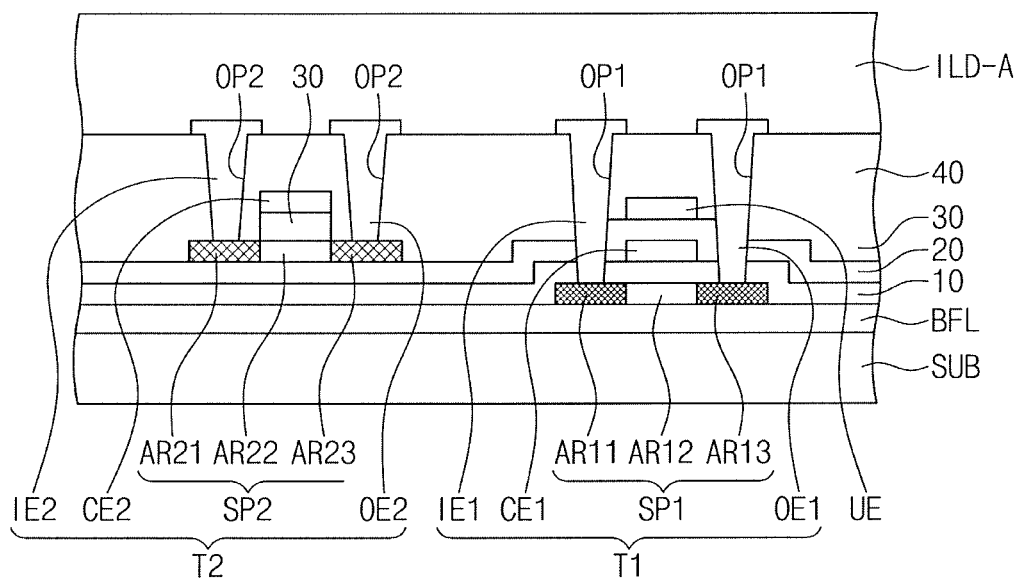
Figure 9L:
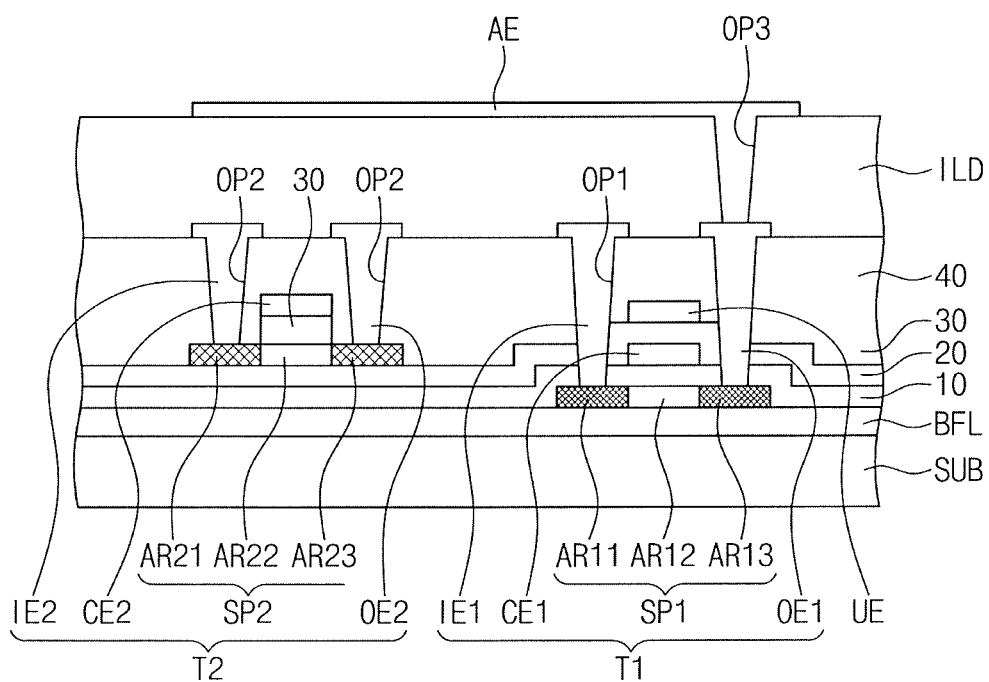
Figure 9M:
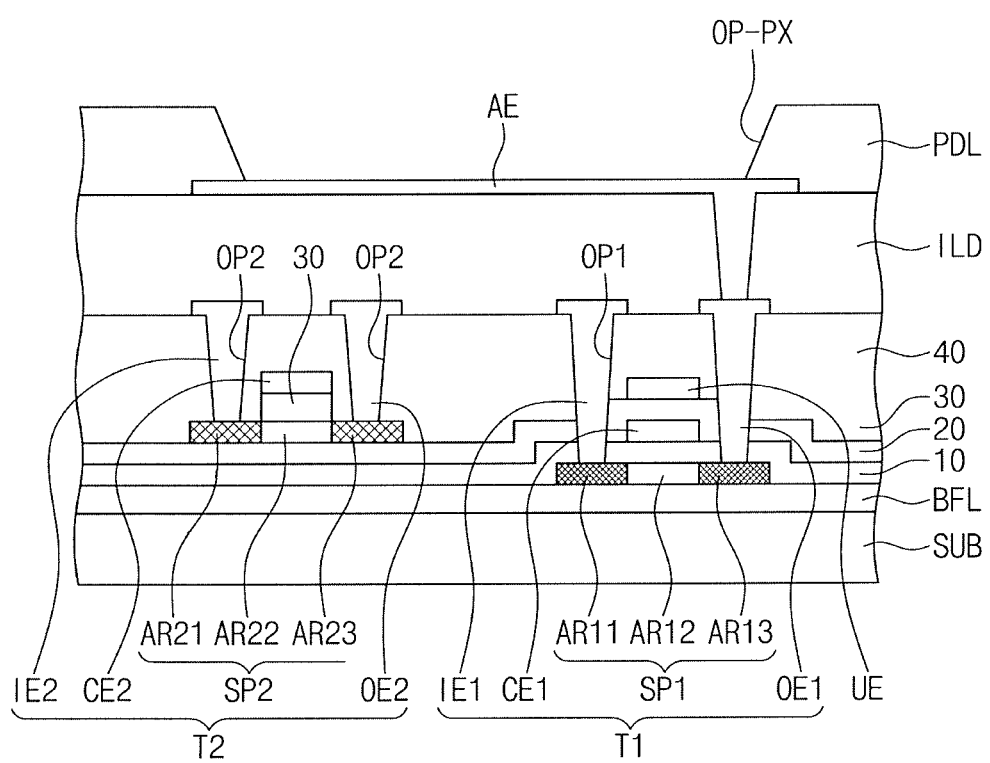
Figure 9N:
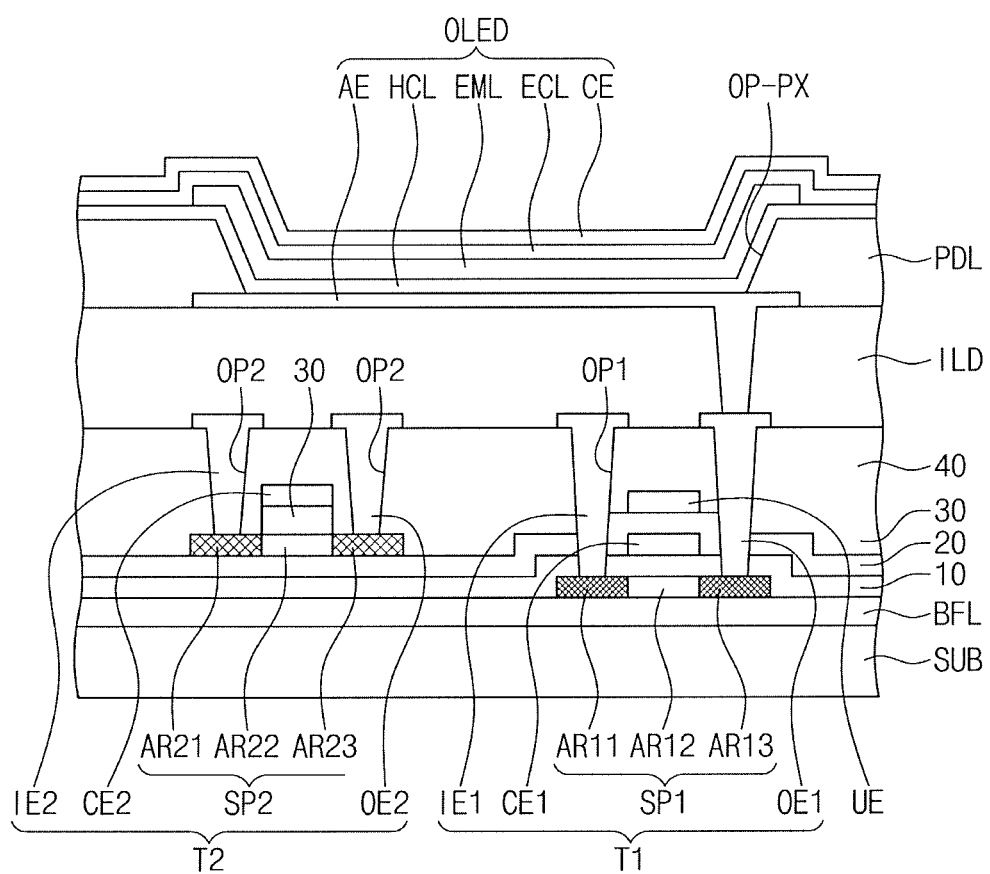

FIGS. 9A to 9N are sectional views illustrating a semiconductor device manufacturing method according to an exemplary embodiment of the present invention.

As shown in FIG. 9A, an initial first semiconductor pattern SP1-A is formed on a substrate SUB. After a layer including a crystalline semiconductor material is formed on the substrate SUB, by patterning it, the initial first semiconductor pattern SP1-A may be formed. After forming of a layer including a crystalline material, the initial first semiconductor pattern SP1-A may include a crystallization operation for crystallizing the semiconductor material.

Forming of a buffer layer BFL on the substrate SUB may be performed before the forming of the initial first semiconductor pattern SP1-A. The buffer layer BFL may prevent an impurity, which is provided from the substrate SUB during processes for manufacturing and using a semiconductor device, from flowing into elements formed on the substrate SUB.

Then, as shown in FIGS. 9B and 9C, a first control electrode CE1 and an initial first semiconductor pattern SP1-A are formed. After an initial first insulating layer 10-1 and a conductive layer CP are formed on the initial first semiconductor pattern SP1-A, the first control electrode CE1 may be formed by patterning the conductive layer CP.

The first control electrode CE1 may correspond to the first control electrode CE1 (see FIG. 3). In an exemplary embodiment of the present invention, the first control electrode CE1 may function as one electrode of a capacitor. Accordingly, in relation to a semiconductor device manufacturing method according to an exemplary embodiment of the present invention, an additional process for forming a first capacitor electrode may be omitted, so that a process time may be reduced.

The initial first insulating layer 10-A is formed on the buffer layer BFL and covers the initial first semiconductor patterns SP1-A. The initial first insulating layer 10-A may be formed by depositing, coating, or printing an inorganic material or an organic material.

As shown in FIG. 9C, the first semiconductor pattern SP1 may be formed by forming first to third areas AR11, AR12, and AR13 on the initial first semiconductor pattern SP1-A. When a predetermined impurity DM is injected to the initial first semiconductor pattern SP1-A, the first area AR11 and the third area AR13 are formed. The first area AR11 and the third area AR13 have a relatively higher doping concentration than the second area AR12.

The impurity DM may include various materials. For example, the impurity DM may include a trivalent element. Thus, the first semiconductor pattern SP1 may be formed of a P-type semiconductor. Alternatively, the impurity DM may include a pentavalent element. Thus, the first semiconductor pattern SP1 may be formed of an N-type semiconductor.

The second area AR12 may overlap the first control electrode CE11 in a plan view. For example, a form on the plane of the second area AR12 may be identical to that on the plane of the first control electrode CE11. During a process for injecting a predetermined dopant material to the initial first semiconductor material SP1-A, the first control electrode CE11 may serve as a mask. Accordingly, a boundary between the first area AR11 and the second area AR12 and a boundary between the second area AR12 and the third area AR13 may be aligned along an edge of the first control electrode CE11.

Then, as shown in FIGS. 9D and 9E, an initial second insulating layer 20-A, an initial second semiconductor pattern SP2-A, and an initial second insulating layer 30-A are formed on the initial first insulating layer 10-A. The initial second insulating layer 20-A may be formed by depositing, coating, or printing an inorganic material or an organic material.

The initial second semiconductor pattern SP2-A includes an oxide semiconductor material. After a layer including an oxide semiconductor material is formed on the initial second insulating layer 20-A, by patterning it, the initial second semiconductor pattern SP2-A may be formed.

After a layer including an inorganic material and/or an organic material is formed on the initial second semiconductor pattern SP2-A, by patterning it, the initial second insulating layer 30-A may be formed. The initial second semiconductor pattern SP2-A and the initial second insulating layer 30-A may be patterned separately through a distinct process.

However, this is merely exemplary, and in an exemplary embodiment of the present invention, the initial second semiconductor pattern SP2-A and the initial second insulating layer 30-A may be patterned by using the same mask. Accordingly, the initial second semiconductor pattern SP2-A and the initial second insulating layer 30-A may have substantially the same plane shape.

Then, as shown in FIG. 9F, an initial second control electrode CE2-A and an upper electrode UE are formed on the initial second insulating layer 20-A. The initial second control electrode CE2-A may cover sides of the initial second semiconductor pattern SP2-A and an upper surface and sides of the initial third insulating layer 30-A.

After a layer including a conductive material is formed on the initial second insulating layer 20-A, by patterning it, the initial second control electrode CE2-A may be formed. The initial second control electrode CE2-A and the upper electrode UE may be patterned at the same time by using one mask. Accordingly, a process time may be shortened and process costs may be reduced.

The upper electrode UE may function as another electrode of a capacitor. Accordingly, in a semiconductor device manufacturing method, according to an exemplary embodiment of the present invention, an additional process for forming a second capacitor electrode may be omitted. Thus, a process time and manufacturing costs may be reduced.

Then, as shown in FIG. 9G, a second control electrode CE2 and a third insulating layer 30 are formed respectively by patterning the initial second control electrode CE2-A and the initial third insulating layer 30-A. The second control electrode CE2 is patterned to expose at least a portion of the initial second semiconductor pattern SP2-A.

After the second control electrode CE2 is formed, the third insulating layer 30 may be patterned by using the second control electrode CE2 as a mask. Accordingly, the second control electrode CE2 and the third insulating layer 30 may have the same shape in a plan view.

Then, as shown in FIG. 9H, an initial fourth insulating layer 40-A is formed. The initial fourth insulating layer 40-A may be formed by depositing an inorganic material on the second control electrode CE2 and the upper electrode UE.

Areas exposed by the third insulating layer 30 in the initial second semiconductor pattern SP2-A may be modified and become the second semiconductor pattern SP2, including a first area AR21, a second area AR22, and a third area AR23. Areas exposed by the third insulating layer 30 in the initial second semiconductor pattern SP2-A may be changed to the first area AR21 and the third area AR23 as predetermined impurities are injected or at least a portion is exposed by an etching gas provided during a process for forming the initial fourth insulating layer 40-A and reduced. Accordingly, the second area AR22 having relatively less impurity inflows or reduction results may be a channel area.

Then, as shown in FIG. 9I, first opening parts OP1 and second opening parts OP2 may be formed to form the first, second, and fourth insulating layers 10, 20, and 40. The first opening parts OP1 overlap the first semiconductor pattern SP1 and the second opening parts OP2 overlap the second semiconductor pattern SP2.

The first opening parts OP1 penetrate the first insulating layer 10, the second insulating layer 20, and the fourth insulating layer 40. The first opening parts OP1 expose at least a portion of the first area AR11 of the first semiconductor pattern SP1 and at least a portion of the third area AR13.

The second opening parts OP2 overlap the second semiconductor pattern SP2. The second opening parts OP2 penetrates the fourth insulating layer 40 to expose at least a portion of the first area AR21 of the second semiconductor pattern SP2 and at least a portion of the third area AR23.

Then, as shown in FIG. 9J, a first input electrode IE1, a first output electrode OE1, a second input electrode IE2, and a second output electrode OE2 are formed on the fourth insulating layer 40. After a layer including a conductive material is formed on the fourth insulating layer 40, by patterning it, the first input electrode IE1, the first output electrode OE1, the second input electrode IE2, and the second output electrode OE2 may be formed.

The first input electrode IE1, the first output electrode OE1, the second input electrode IE2, and the second output electrode OE2 fill each of the first opening parts OP1 and the second opening parts OP2. The first input electrode IE1 and the first output electrode OE1 are connected to the first area AR11 of the first semiconductor pattern SP1 and the third area AR13 of the first semiconductor pattern SP1, respectively, through the first opening parts OP1 to form a first transistor T1. The second input electrode IE1 and the second output electrode OE2 are connected to the first area AR21 of the second semiconductor pattern SP2 and the third area AR23 of the second semiconductor pattern SP2, respectively, to form a second transistor T2.

Then, as shown in FIG. 9K, an initial interlayer ILD-A is formed on the fourth insulating layer 40. The initial interlayer ILD-A may be formed by depositing, coating, or printing an inorganic material or an organic material on the fourth insulating layer 40.

Then, as shown in FIG. 9L, an interlayer ILD and a first electrode AE are formed. The interlayer ILD may be formed to have a through hole OP3 in the initial interlayer ILD-A. The through hole OP3 may be formed to overlap the first output electrode OE1.

The first electrode AE may correspond to the above-mentioned lower electrode. After a conductive material is formed on the interlayer ILD, by patterning it, the first electrode AE may be formed. The first electrode AE fills the through hole OP3 to be connected to the first output electrode OE1.

Then, as shown in FIG. 9M, a pixel definition layer PDL is formed on the interlayer ILD. The pixel definition layer PDL may be formed to have a predetermined opening part OP-PX after an organic material or an inorganic material is deposited, applied or printed on the interlayer ILD. The opening part OP-PX exposes at least a portion of the first electrode AE.

Then, as shown in FIG. 9N, a hole control layer HCL, a light emitting layer EML, an electron control layer ECL, and a cathode electrode CE are sequentially formed on the pixel definition layer PDL. The hole control layer HCL may correspond to the above-mentioned first charge control layer and the electron control layer ECL may correspond to the above-mentioned second charge control layer. The anode electrode AE, the hole control layer HCL, the light emitting layer EML, the electron control layer ECL, and the cathode electrode CE may be included in an organic light emitting device OLED.

However, this is merely exemplary, and the hole control layer HCL and the electronic control layer ECL may be formed in the reverse order. For example, after the electron control layer ECL is formed first, the light emitting layer EML and the hole control layer HCL are then sequentially formed. In addition, each of the hole control layer HCL, the light emitting layer EML, and the electron control layer ECL may be formed by a single process or a plurality of processes.

FIGS. 10A to 10J are sectional views illustrating a semiconductor device manufacturing method according to an exemplary embodiment of the present invention.

Figure 10A:
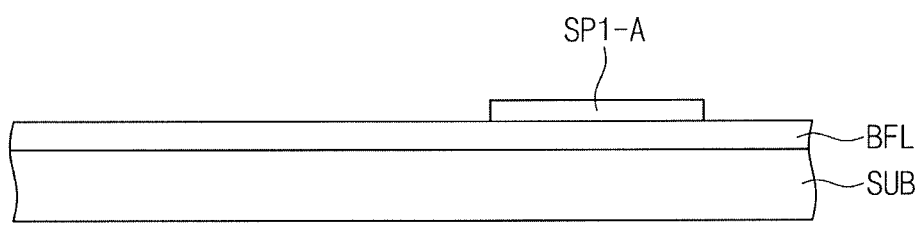
FIGS. 10A to 10J are sectional views illustrating a semiconductor device manufacturing method according to an exemplary embodiment of the present invention.
Figure 10B:
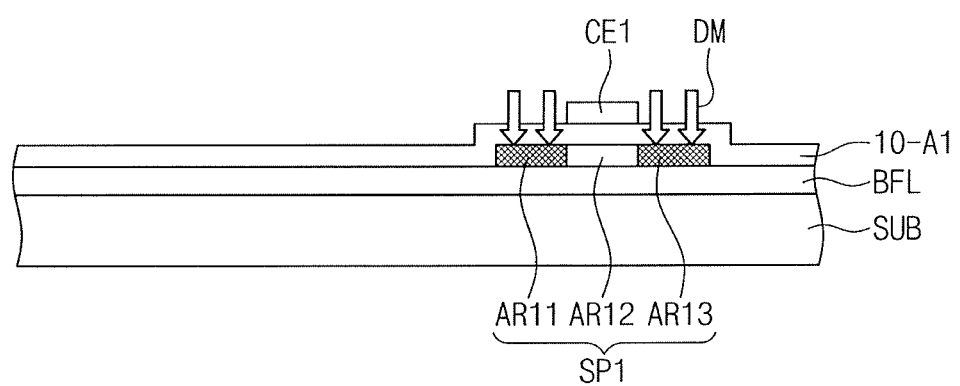

As shown in FIG. 10A, a buffer layer BFL and an initial first semiconductor pattern SP1-A are formed on a substrate SUB. Then, as shown in FIG. 10B, a first insulating layer 10-A and a first control electrode CE1 are formed on the buffer layer BFL. As a predetermined dopant is injected through the initial first insulating layer 10-A, a first semiconductor pattern SP1 may be formed to have a first area AR11, a second area AR12, and a third area AR13.

Figure 10C:
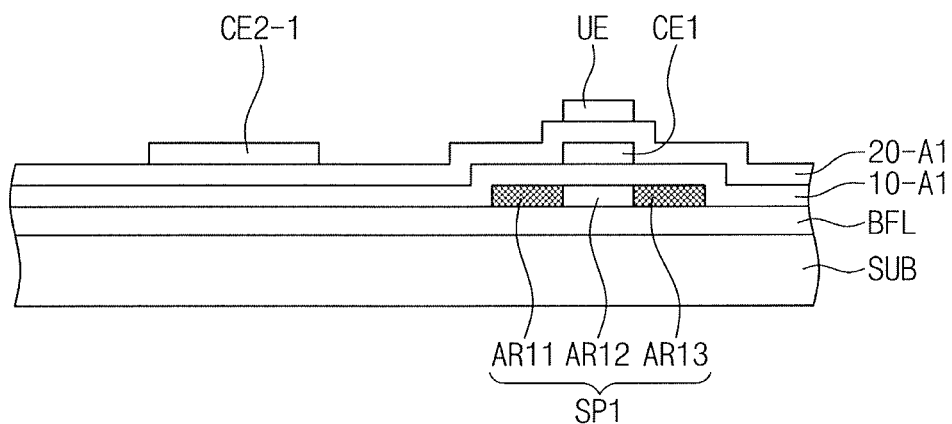

Then, as shown in FIG. 10C, an initial second insulating layer 20-A1, a second control electrode CE2-1, and an upper electrode UE are formed on an initial first insulating layer 10-A1. The initial second insulating layer 20-A1 may be formed by depositing, coating, or printing an organic material or an inorganic material on the initial first insulating layer 10-A1.

After a layer including a conductive material is formed on the initial second insulating layer 20-A1, by patterning it, the second control electrode CE2-1 and the upper electrode UE may be formed. Thus, the second control electrode CE2-1 and the upper electrode UE may be formed at the same time.

Figure 10D:
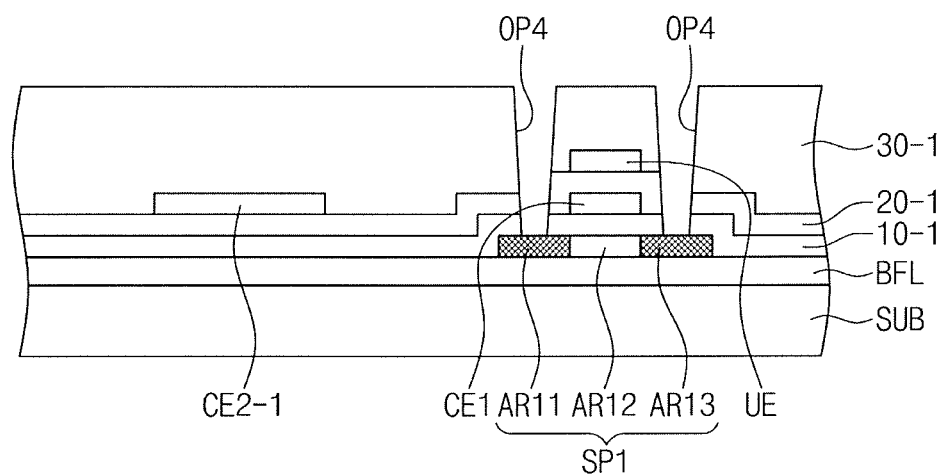

Then, as shown in FIG. 10D, first to third insulating layers 10-1, 20-1, and 30-1 are formed by forming fourth opening parts OP4. After a layer including an organic material or an inorganic material is formed on the initial second insulating layer 20-A1, the fourth opening parts OP4, overlapping each of the first area AR11 and the third area AR13, are formed. The fourth opening parts OP4 expose each of the first area AR11 and the third area AR13 of the first semiconductor pattern SP1.

Figure 10E:
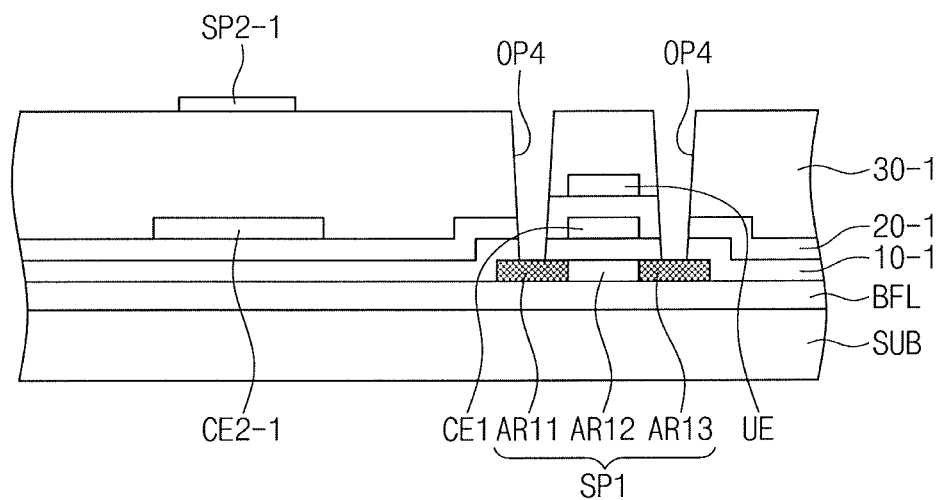

Then, as shown in FIG. 10E, a second semiconductor pattern SP2-1 is formed on the third insulating layer 30-1. After a layer including an oxide semiconductor material is formed on the third insulating layer 30-1, by patterning it, the second semiconductor pattern SP2-1 may be formed.

Figure 10F:
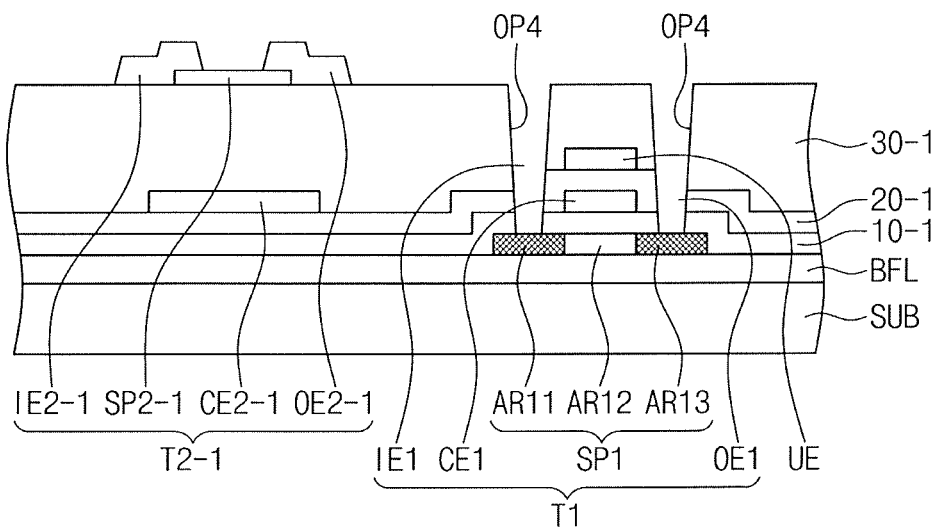

Then, as shown in FIG. 10F, a first input electrode IE1-1, a first output electrode OE1-1, a second input electrode IE2-1, and a second output electrode OE2-1 are formed on the third insulating layer 30-1. After a layer including a conductive material is formed on the third insulating layer 30-1, by patterning it, the first input electrode IE1-1, the first output electrode OE1-1, the second input electrode IE2-1, and the second output electrode OE2-1 may be formed. In addition, the first input electrode IE1-1, the first output electrode OE1-1, the second input electrode IE2-1, and the second output electrode OE2-1 may be formed at the same time. Accordingly, a process for separately forming the first input electrode TE1 the first output electrode OE1-1, the second input electrode IE2-1, and the second output electrode OE2-1 may be omitted. Thus, a process time may be shortened and process costs may be reduced.

As the initial second semiconductor pattern SP2-A1 contacts the second input electrode IE2-1 and the second output electrode OE2-1, the initial second semiconductor pattern SP2-A1 may be formed as the second semiconductor pattern SP2-1 where a predetermined ohmic contact part is formed. An area that does not overlap the second input electrode IE2-1 and the second output electrode OE2-1 in the second semiconductor pattern SP2-1 may serve as a channel area of the second transistor T2-1. However, this is merely exemplary, and before the second input electrode IE2-1 and the second output electrode OE2-1 are formed, the second semiconductor pattern SP2-1 may be provided in a state that impurities are doped therein in advance.

Figure 10G:
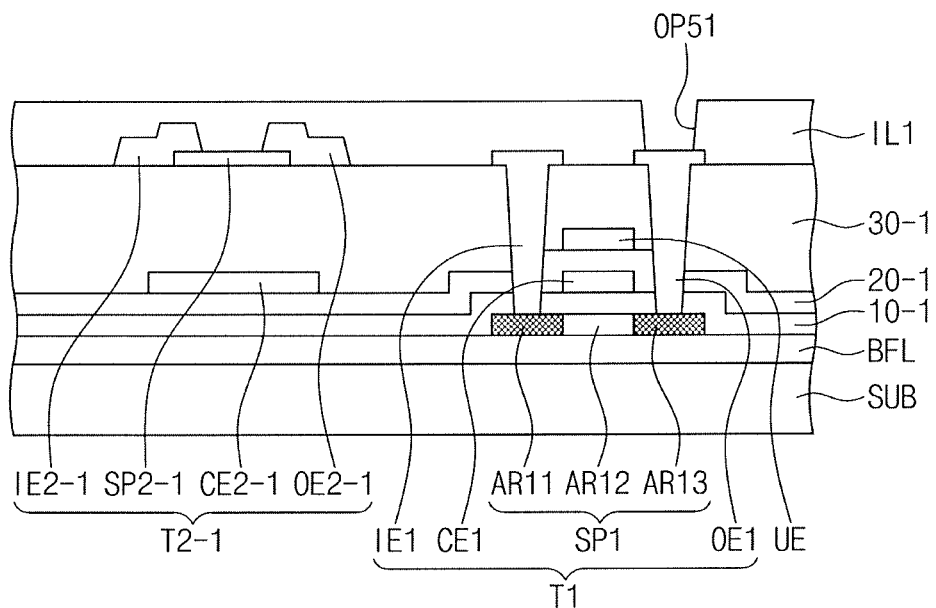
Figure 10H:
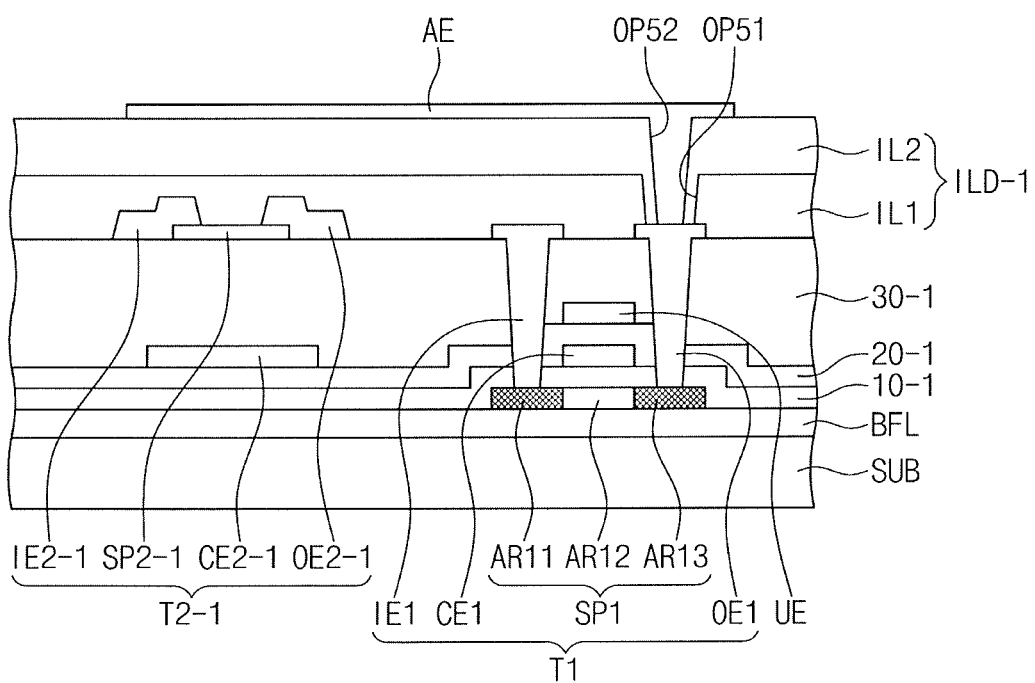

Then, as shown in FIGS. 10G and 10H, the interlayer ILD-1 and the anode electrode AE may be formed on the third insulating layer 30-1. The interlayer ILD-1 includes a first layer IL1 and a second layer IL2.

As shown in FIG. 10G, after a layer including an organic material or an inorganic material is formed on the third insulating layer 30-1, the first layer IL1 is formed to have a through hole OP51. The first layer IL1 covers the second input electrode IE2-1, the second output electrode OE2-1, and the second semiconductor pattern SP2-1. The through hole OP51 is formed in an area that overlaps the first output electrode OE1 of the first transistor T1 to expose at least a portion of the first output electrode OE1.

As shown in FIG. 10H, after a layer including an organic material or an inorganic material is formed on the first layer IL1, the second layer IL2 is formed to have a through hole OP52. As the second layer IL2 is formed after the through hole OP51 is formed, the second layer IL2 fills at least a portion of the through hole OP51. The through hole OP52 is formed in the second layer IL2 to overlap the first output electrode OE1. The through hole OP52 of the second layer IL2 may overlap the through hole OP51 of the first layer ILL The first electrode AE is formed on the second layer IL2. After a layer including a conductive material is formed on the second layer IL2, by patterning it, the first electrode AE may be formed. The first electrode AE may be connected to the first output electrode OE1 by filling the through hole OP52 of the second layer IL2.

Figure 10I:
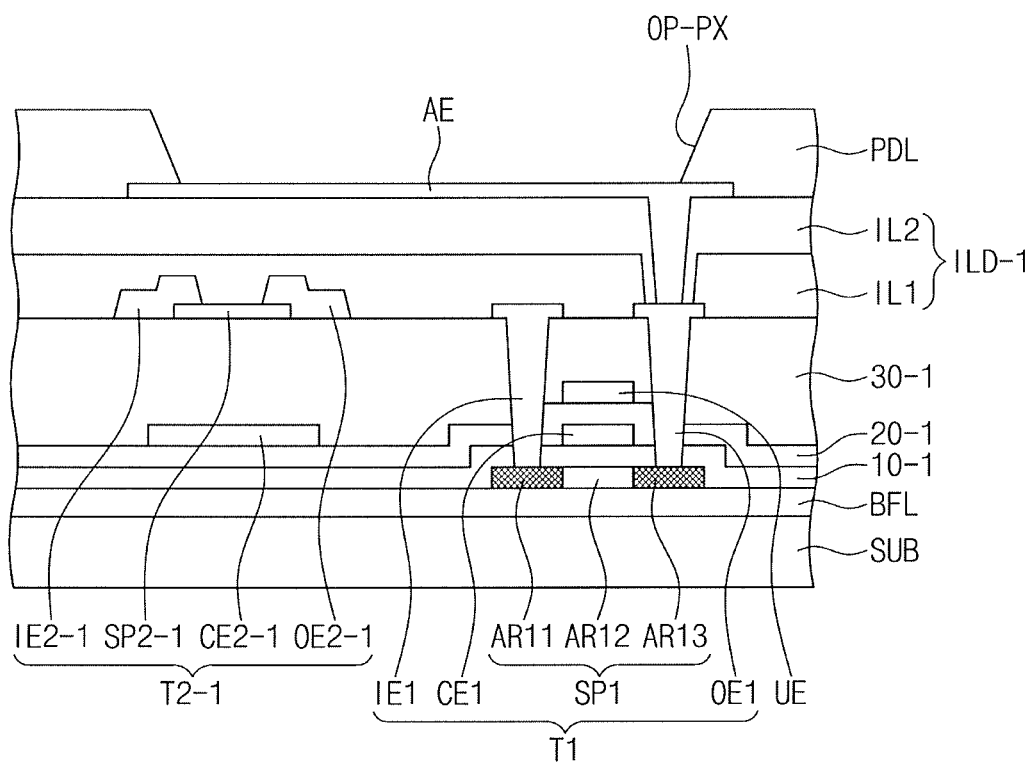
Figure 10J:
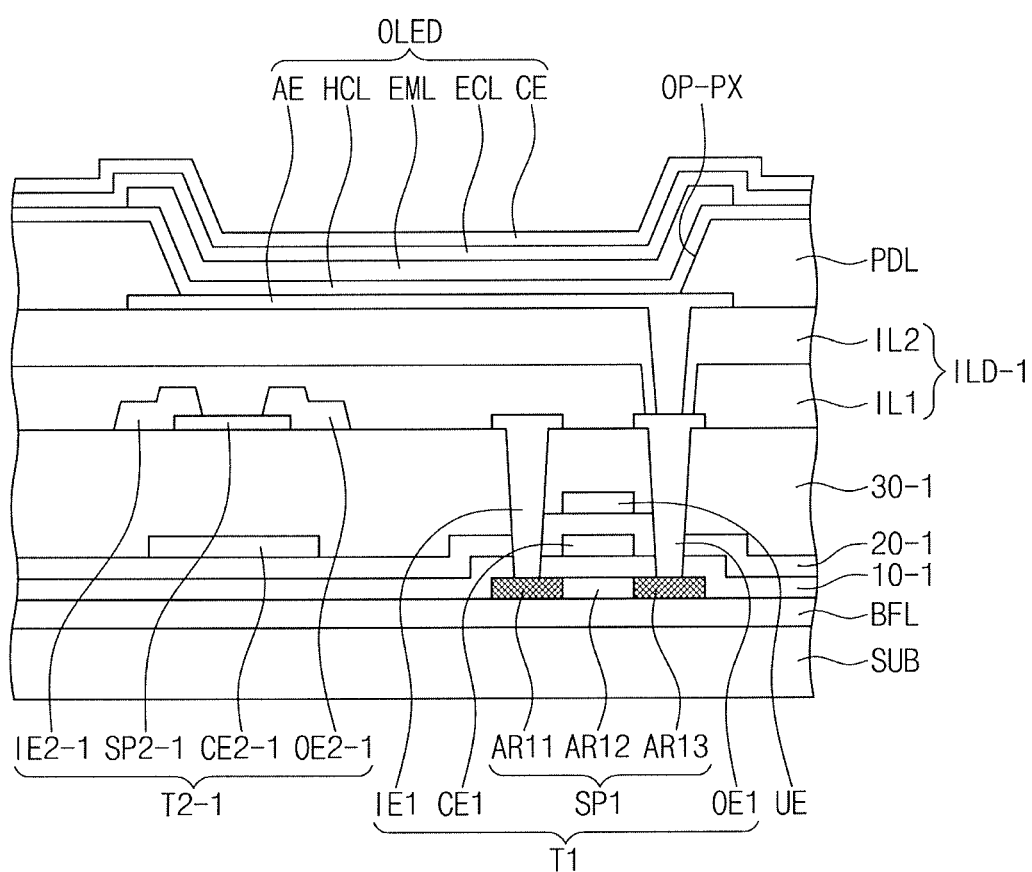

Then, as shown in FIGS. 10I and 10J, the pixel definition layer PDL, the plurality of organic layers HCL, EML, and ECL, and the second electrode CE may be formed on the interlayer ILD-1. The first electrode AE, the plurality of organic layers HCL, EML, and ECL, and the second electrode CE may be included in an organic light emitting device OLED.

According to an exemplary embodiment of the present invention, a crystalline semiconductor having a high mobility is used for a driving transistor. In addition an oxide semiconductor having excellent on-off characteristics is used for a control transistor. Thus, a semiconductor device may be formed to have increased driving characteristics and increased reliability.

In addition, since components of a capacitor electrode and a transistor may be formed at the same time, process costs may be reduced and a process time may be shortened.

In addition, the degree of integration of a plurality of transistors including different semiconductor materials may be increased. Thus, a high-resolution semiconductor device may be provided.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. A semiconductor device, comprising:
    a base substrate;
    a first transistor disposed above the base substrate in a direction that is perpendicular to a plane of the base substrate, the first transistor comprising a connection electrode, a first output electrode, a first control electrode, and a first semiconductor pattern including a crystalline semiconductor;
    a second transistor disposed above the base substrate in the direction perpendicular to the plane of the base substrate, the second transistor comprising a second input electrode, the connection electrode, a second control electrode, and a second semiconductor pattern including an oxide semiconductor;
    a plurality of insulating layers disposed above the base substrate in the direction perpendicular to the plane of the base substrate; and
    an upper electrode disposed above the first control electrode, in the direction perpendicular to the plane of the base substrate, with at least one insulating layer of the plurality of insulating layers interposed between the upper electrode and the first control electrode,
    wherein the upper electrode at least partially overlaps the first control electrode, in the direction perpendicular to the plane of the base substrate, and forms a capacitor with the first control electrode, and
    wherein the connection electrode is a single integral electrode configured as an output electrode of the second transistor and an input electrode of the first transistor.

2. The semiconductor device of claim 1, wherein the first control electrode and the upper electrode each at least partially overlap the first semiconductor pattern in the direction perpendicular to the plane of the base substrate.

3. The semiconductor device of claim 2, wherein the first control electrode is disposed between the first semiconductor pattern and the upper electrode.

4. The semiconductor device of claim 1, wherein the plurality of insulating layers comprises:
- a first insulating layer disposed between the first control electrode and the first semiconductor pattern;
- a second insulating layer disposed above the first insulating layer in the direction perpendicular to the plane of the base substrate, between the first control electrode and the upper electrode; and
- a third insulating layer disposed above the second insulating layer in the direction perpendicular to the plane of the base substrate, between the second semiconductor pattern and the second control electrode.

5. The semiconductor device of claim 4, wherein the second control electrode is disposed above the second semiconductor pattern in the direction perpendicular to the plane of the base substrate.

6. The semiconductor device of claim 4, wherein the third insulating layer comprises a first portion at least partially overlapping, in the direction perpendicular to the plane of the base substrate, the second control electrode and a second portion at least partially overlapping the first control electrode in the direction perpendicular to the plane of the base substrate.

7. The semiconductor device of claim 6, wherein the second portion is disposed between the first control electrode and the upper electrode.

8. The semiconductor device of claim 1, wherein the first semiconductor pattern and the second semiconductor pattern are disposed on different layers from each other.

9. The semiconductor device of claim 8, wherein an end of the first semiconductor pattern and an end of the second semiconductor pattern are aligned along a same imaginary line in a plan view.

10. The semiconductor device of claim 1, wherein the connection electrode penetrates at least a portion of the second semiconductor pattern to be connected to the second semiconductor pattern and the first semiconductor pattern.

11. The semiconductor device of claim 1, further comprising an organic light emitting diode connected to the first output electrode.

12. A semiconductor device, comprising:
- a base substrate;
- a first transistor disposed above the base substrate in a direction that is perpendicular to a plane of the base substrate, the first transistor comprising a connection electrode, a first output electrode, a first control electrode, and a first semiconductor pattern including a crystalline semiconductor;
- a second transistor disposed above the base substrate in the direction perpendicular to the plane of the base substrate, the second transistor comprising a second input electrode, the connection electrode, a second control electrode, and a second semiconductor pattern including an oxide semiconductor;
- a plurality of insulating layers disposed above the base substrate in the direction perpendicular to the plane of the base substrate; and
- an upper electrode disposed above the first control electrode, in the direction perpendicular to the plane of the base substrate, wherein the first semiconductor pattern, the first control electrode and the upper electrode are stacked on one another with a first insulating layer of the plurality of insulating layers disposed between the first semiconductor pattern and the first control electrode, and a second insulating layer of the plurality of insulating layers disposed between the first control electrode and the upper electrode, wherein the upper electrode and the first control electrode form a capacitor, and wherein the connection electrode is a single electrode configured as an output electrode of the second transistor and an input electrode of the first transistor.

* * * * *